United States Patent
Chen et al.

(10) Patent No.: US 11,605,720 B2
(45) Date of Patent: Mar. 14, 2023

(54) METAL GATE CAP

(71) Applicant: Taiwan Semiconductor Manufacturing Company, Ltd., Hsinchu (TW)

(72) Inventors: Chia-Wei Chen, Hsinchu (TW); Wei Cheng Hsu, Hsinchu (TW); Hui-Chi Chen, Hsinchu County (TW); Jian-Hao Chen, Hsinchu (TW); Kuo-Feng Yu, Hsinchu County (TW); Shih-Hang Chiu, Taichung (TW); Wei-Cheng Wang, Hsinchu (TW); Yen-Ju Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 73 days.

(21) Appl. No.: 17/186,472

(22) Filed: Feb. 26, 2021

(65) Prior Publication Data
US 2022/0278218 A1   Sep. 1, 2022

(51) Int. Cl.
| H01L 29/423 | (2006.01) |
| H01L 27/092 | (2006.01) |
| H01L 29/786 | (2006.01) |
| H01L 29/49 | (2006.01) |
| H01L 21/8238 | (2006.01) |

(52) U.S. Cl.
CPC ........... *H01L 29/42392* (2013.01); *H01L 21/823828* (2013.01); *H01L 27/092* (2013.01); *H01L 29/42376* (2013.01); *H01L 29/4966* (2013.01); *H01L 29/78696* (2013.01)

(58) Field of Classification Search
CPC ....... H01L 29/42392; H01L 21/823828; H01L 27/092; H01L 29/42376; H01L 29/4966; H01L 29/78696
USPC ........................................................ 257/401
See application file for complete search history.

(56) References Cited

U.S. PATENT DOCUMENTS

| 9,818,872 | B2 | 11/2017 | Ching et al. |
| 9,887,269 | B2 | 2/2018 | Ching et al. |
| 9,899,398 | B1 | 2/2018 | Colinge et al. |
| 10,032,627 | B2 | 7/2018 | Lee et al. |

(Continued)

FOREIGN PATENT DOCUMENTS

TW         202044414 A       12/2020

*Primary Examiner* — Tong-Ho Kim
(74) *Attorney, Agent, or Firm* — Haynes and Boone, LLP

(57) ABSTRACT

The present disclosure provides a semiconductor device and a method of forming the same. The semiconductor device includes a first channel members being vertically stacked, a second channel members being vertically stacked, an n-type work function layer wrapping around each of the first channel members, a first p-type work function layer over the n-type work function layer and wrapping around each of the first channel members, a second p-type work function layer wrapping around each of the second channel members, a third p-type work function layer over the second p-type work function layer and wrapping around each of the second channel members, and a gate cap layer over a top surface of the first p-type work function layer and a top surface of the third p-type work function layer such that the gate cap layer electrically couples the first p-type work function layer and the third p-type work function layer.

20 Claims, 24 Drawing Sheets

(56) References Cited

U.S. PATENT DOCUMENTS

| | | |
|---|---|---|
| 10,109,721 B2 | 10/2018 | Lin et al. |
| 10,157,799 B2 | 12/2018 | Ching et al. |
| 10,199,502 B2 | 2/2019 | Huang et al. |
| 10,290,546 B2 | 5/2019 | Chiang et al. |
| 10,475,902 B2 | 11/2019 | Lee et al. |
| 2015/0214220 A1* | 7/2015 | Seo .................... H01L 29/4983 |
| | | 257/499 |
| 2018/0175036 A1 | 6/2018 | Ching et al. |
| 2018/0374926 A1* | 12/2018 | Lee .................... H01L 27/1251 |
| 2019/0393307 A1 | 12/2019 | Reznicek |
| 2020/0381311 A1 | 12/2020 | Kim |
| 2021/0028291 A1* | 1/2021 | Park .................... H01L 29/0638 |

* cited by examiner

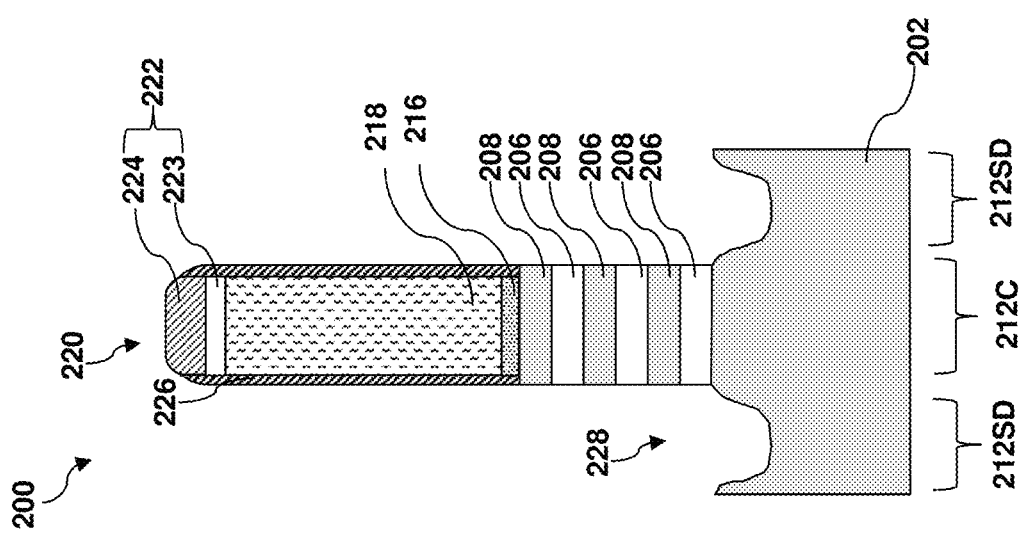
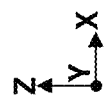
Fig. 7

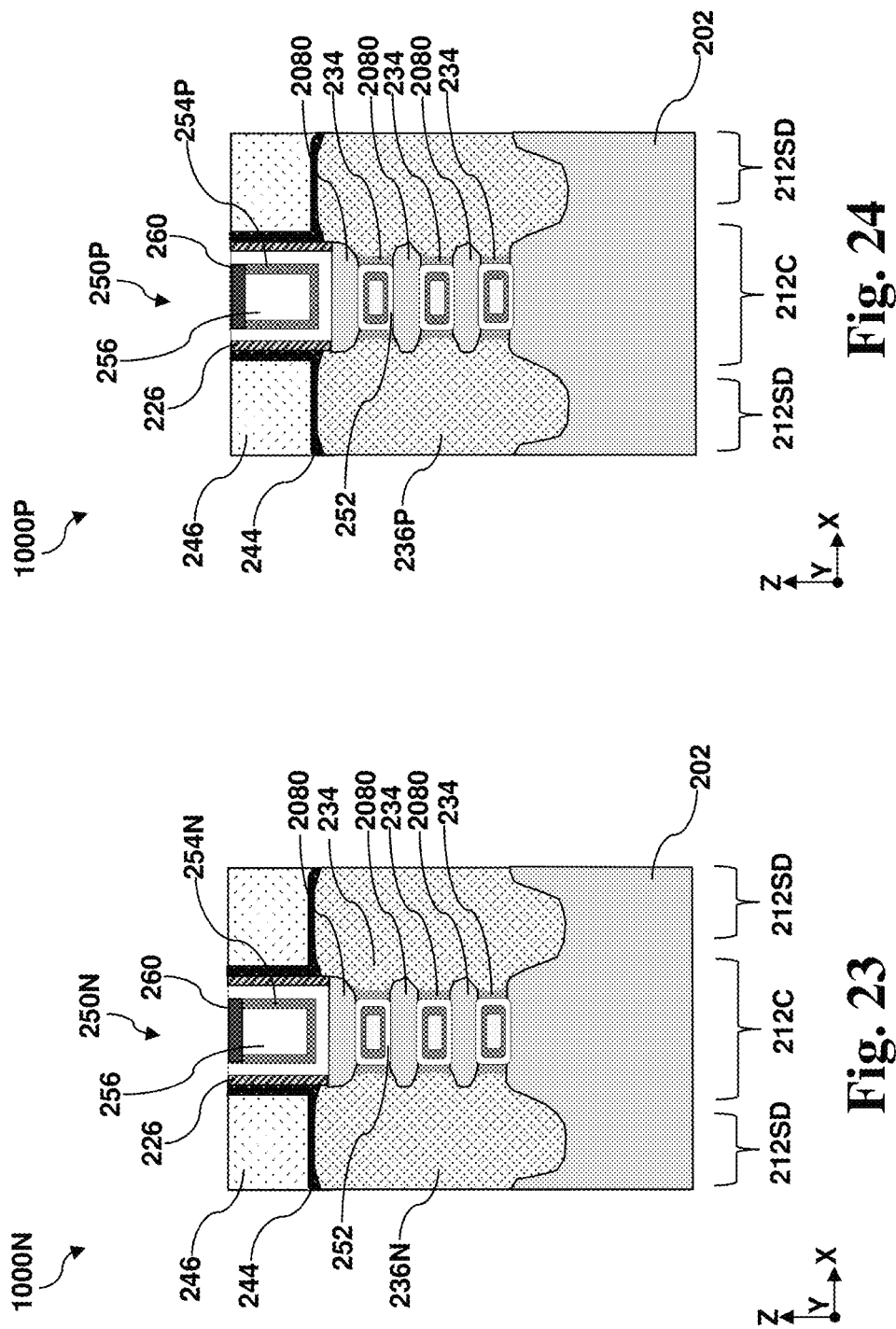

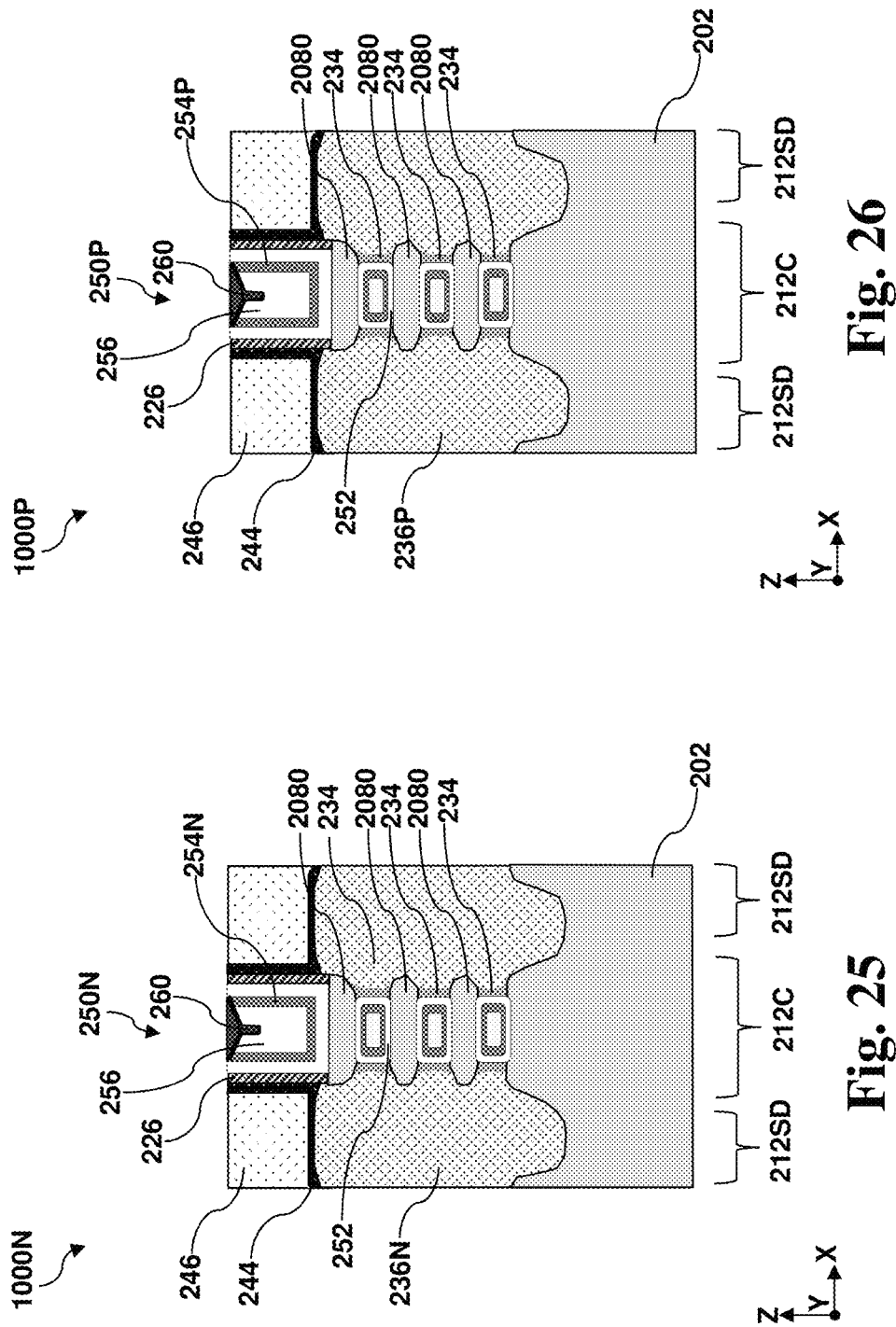

METAL GATE CAP

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

Due to the small dimensions of MBC transistors, gate structures for MBC transistors tend to have small volume and may not include a metal fill layer that is more electrically conductive than work function layers. The lack of the metal fill layer may contribute to high gate contact resistance. Therefore, while conventional MBC transistors are generally adequate to their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-21 illustrate fragmentary cross-sectional views of a workpiece during a fabrication process according to the method of FIG. 1, according to one or more aspects of the present disclosure.

FIGS. 23 and 25 each illustrate a fragmentary cross-sectional view of an n-type MBC transistor in FIG. 22, according to one or more aspects of the present disclosure.

FIGS. 24 and 26 each illustrate a fragmentary cross-sectional view of a p-type MBC transistor in FIG. 22, according to one or more aspects of the present disclosure.

DETAILED DESCRIPTION

Figure 1:
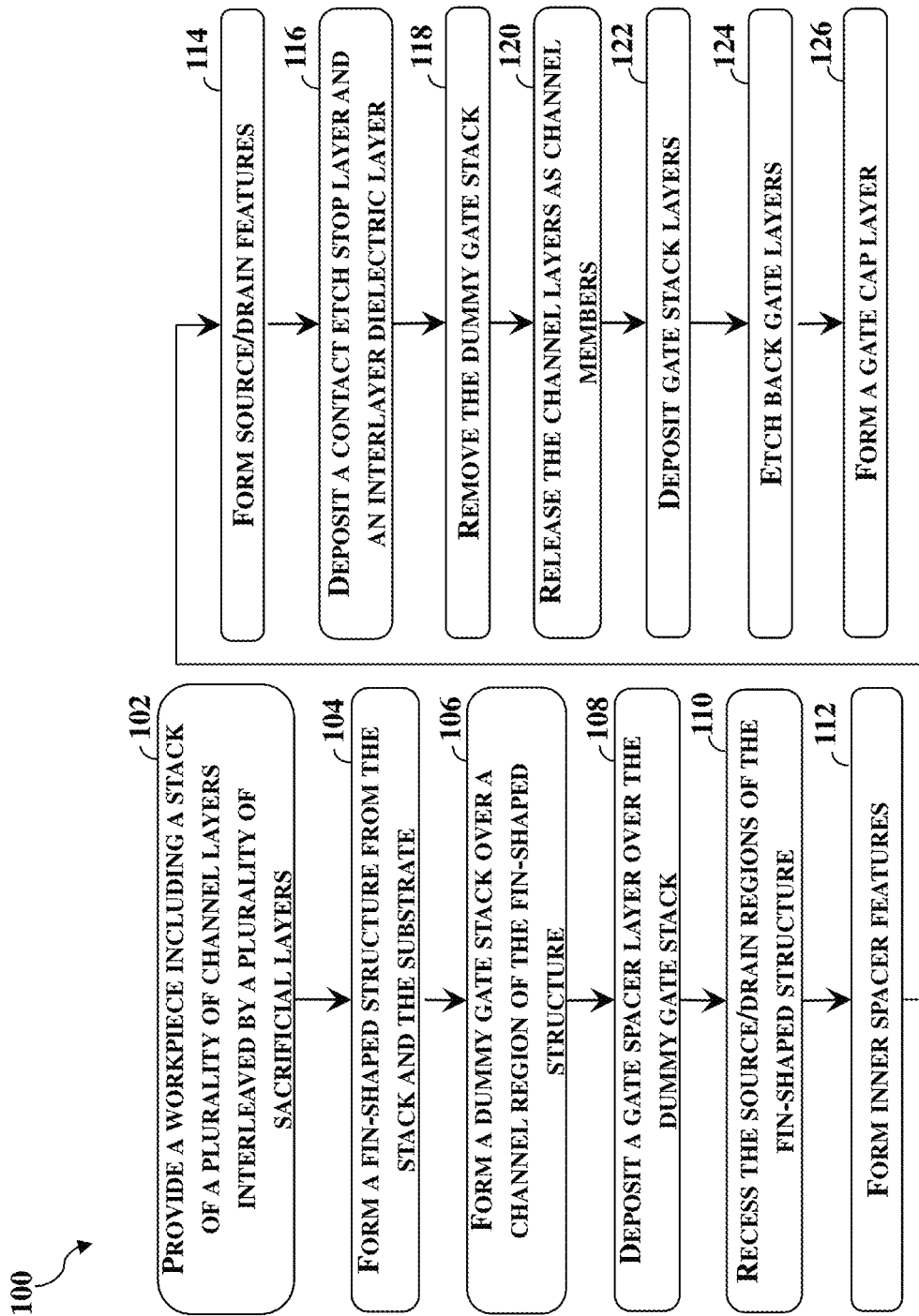
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to multi-gate transistors and fabrication methods, and more particularly to MBC transistors with a gate cap layer. Channel regions of an MBC transistor may be disposed in nanowire channel members, bar-shaped channel members, nanosheet channel members, nanostructure channel members, column-shaped channel members, post-shaped channel members, and/or other suitable channel configurations. Depending on the shapes of the channel members, MBC transistors may also be referred to as nanowire transistors or nanosheet transistors. Despite of the shapes, each of the channel members of an MBC transistor is wrapped around by a gate structure that includes an interfacial layer, a high-k gate dielectric layer, and at least one work function layer. According to methods of the present disclosure, after the channel members in the channel region are released. Various gate stack layers in the gate structure, such as the interfacial layer, the high-k gate dielectric layer, the at least one work function layer are sequentially formed or deposited over and around the channel members. After the formation or deposition of the gate stack layers, the gate stack layers are etched back until a recess or a dent is formed on or in the gate stack layers. A tungsten gate cap layer is then deposited over the recessed gate stack layers, including over the recess or dent. It is observed that the implementation of the tungsten gate cap layer according to the present disclosure may reduce the gate contact resistance by about one order of magnitude and improve the on-current by about 3% and about 5%.

The various aspects of the present disclosure will now be described in more detail with reference to the figures. In that regard, FIG. 1 is a flowchart illustrating a method 100 of forming a semiconductor device from a workpiece according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Method 100 is described below in conjunction with FIG. 2-21, which are fragmentary cross-sectional views of workpiece 200 at different stages of fabrication according to embodiments of the method 100 in FIG. 1. Because the workpiece 200 will be fabricated into a semiconductor device, the workpiece 200 may be referred to herein as a semiconductor device 200 as the context requires. For avoidance, the X, Y and Z directions in FIGS. 2-21 are perpendicular to one another. Throughout the present disclosure, like reference numerals denote like features, unless otherwise expressly excepted.

Figure 2:
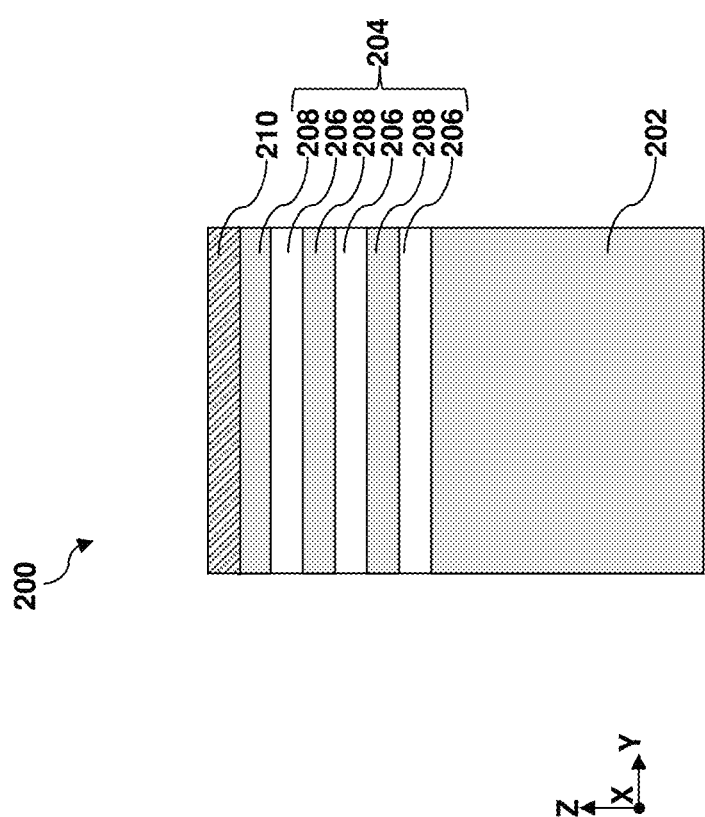

Referring to FIGS. 1 and 2, method 100 includes a block 102 where a stack 204 of alternating semiconductor layers is formed over the workpiece 200. As shown in FIG. 2, the workpiece 200 includes a substrate 202. In some embodiments, the substrate 202 may be a semiconductor substrate such as a silicon (Si) substrate. The substrate 202 may include various doping configurations depending on design requirements as is known in the art. In embodiments where the semiconductor device is p-type, an n-type doping profile (i.e., an n-type well or n-well) may be formed on the substrate 202. In some implementations, the n-type dopant for forming the n-type well may include phosphorus (P) or arsenide (As). In embodiments where the semiconductor device is n-type, a p-type doping profile (i.e., a p-type well or p-well) may be formed on the substrate 202. In some implementations, the n-type dopant for forming the p-type well may include boron (B) or gallium (Ga). The suitable doping may include ion implantation of dopants and/or diffusion processes. The substrate 202 may also include other semiconductors such as germanium (Ge), silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) or a germanium-on-insulator (GeOI) structure, and/or may have other suitable enhancement features.

In some embodiments, the stack 204 includes sacrificial layers 206 of a first semiconductor composition interleaved by channel layers 208 of a second semiconductor composition. The first and second semiconductor compositions may be different. In some embodiments, the sacrificial layers 206 include silicon germanium (SiGe) and the channel layers 208 include silicon (Si). It is noted that three (3) layers of the sacrificial layers 206 and three (3) layers of the channel layers 208 are alternately arranged as illustrated in FIG. 2, which is for illustrative purposes only and not intended to be limiting beyond what is specifically recited in the claims. It can be appreciated that any number of epitaxial layers may be formed in the stack 204. The number of layers depends on the desired number of channels members for the semiconductor device 200. In some embodiments, the number of channel layers 208 is between 2 and 10.

In some embodiments, all sacrificial layers 206 may have a substantially uniform first thickness and all of the channel layers 208 may have a substantially uniform second thickness. As described in more detail below, the channel layers 208 or parts thereof may serve as channel member(s) for a subsequently-formed multi-gate device and the thickness of each of the channel layers 208 is chosen based on device performance considerations. The sacrificial layers 206 in channel regions(s) may eventually be removed and serve to define a vertical distance between adjacent channel region(s) for a subsequently-formed multi-gate device and the thickness of each of the sacrificial layers 206 is chosen based on device performance considerations.

The layers in the stack 204 may be deposited using a molecular beam epitaxy (MBE) process, a vapor phase deposition (VPE) process, and/or other suitable epitaxial growth processes. As stated above, in at least some examples, the sacrificial layers 206 include an epitaxially grown silicon germanium (SiGe) layer and the channel layers 208 include an epitaxially grown silicon (Si) layer. In some embodiments, the sacrificial layers 206 and the channel layers 208 are substantially dopant-free (i.e., having an extrinsic dopant concentration from about 0 $cm^{-3}$ to about $1 \times 10^{17}$ $cm^{-3}$), where for example, no intentional doping is performed during the epitaxial growth processes for the stack 204.

Figure 3:
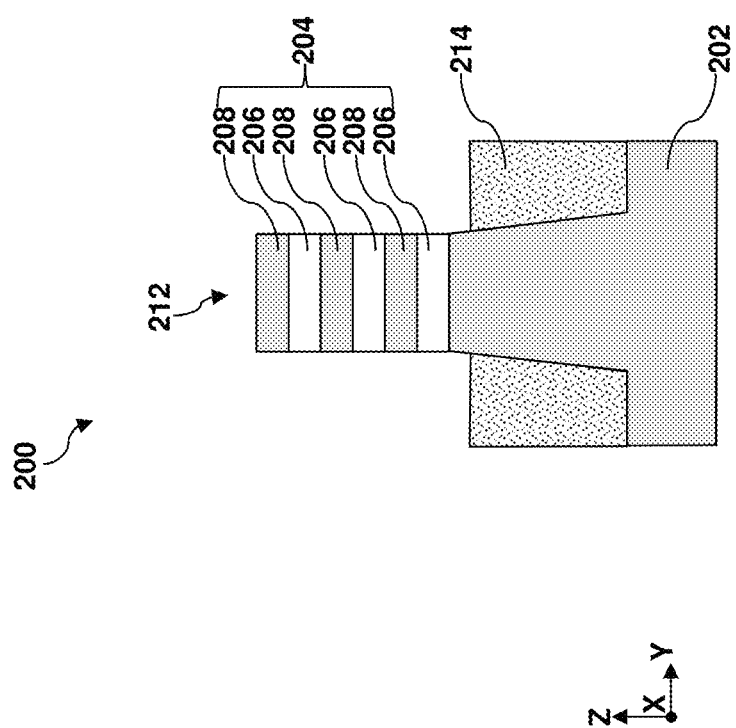

Referring still to FIGS. 1, 2 and 3, method 100 includes a block 104 where a fin-shaped structure 212 is formed from the stack 204 and the substrate 202. To pattern the stack 204, a hard mask layer 210 (shown in FIG. 2) may be deposited over the stack 204 to form an etch mask. The hard mask layer 210 may be a single layer or a multi-layer. For example, the hard mask layer 210 may include a pad oxide layer and a pad nitride layer over the pad oxide layer. The fin-shaped structure 212 may be patterned from the stack 204 and the substrate 202 using a lithography process and an etch process. The lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etching (e.g., RIE etching), wet etching, and/or other etching methods. As shown in FIG. 3, the etch process at block 104 forms trenches extending through the stack 204 and a portion of the substrate 202. The trenches define the fin-shaped structures 212. In some implementations, double-patterning or multi-patterning processes may be used to define fin-shaped structures that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structure 212 by etching the stack 204. As shown in FIG. 3, the fin-shaped structure 212, along with the sacrificial layers 206 and the channel layers 208 therein, extends vertically along the Z direction and lengthwise along the X direction.

An isolation feature 214 is formed adjacent the fin-shaped structure 212. In some embodiments, the isolation feature 214 may be formed in the trenches to isolate the fin-shaped structures 212 from a neighboring active region. The isolation feature 214 may also be referred to as a shallow trench isolation (STI) feature 214. By way of example, in some embodiments, a dielectric layer is first deposited over the substrate 202, filling the trenches with the dielectric layer. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, a spin-on coating process, and/or other suitable process. The deposited dielectric material is then thinned and planarized, for example by a chemical mechanical polishing (CMP) process. The planarized dielectric layer is further recessed or pulled-back by a dry etching process, a wet etching process, and/or a combination thereof to form the STI feature 214. The fin-shaped structure 212 rises above the STI feature 214 after the recessing.

Figure 4:
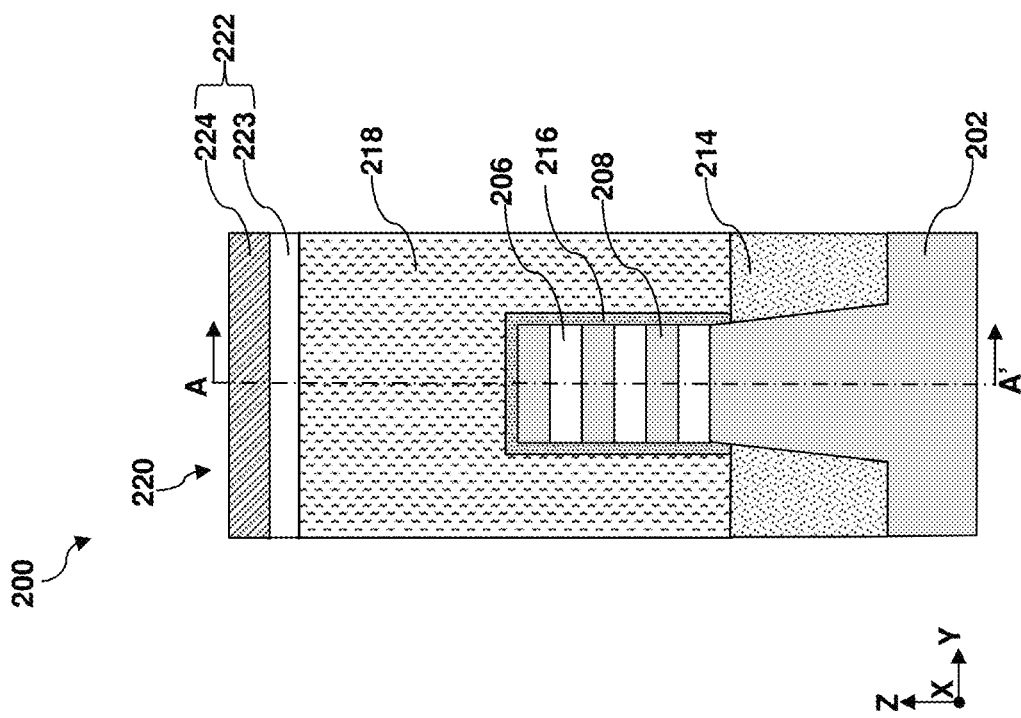
Figure 5:
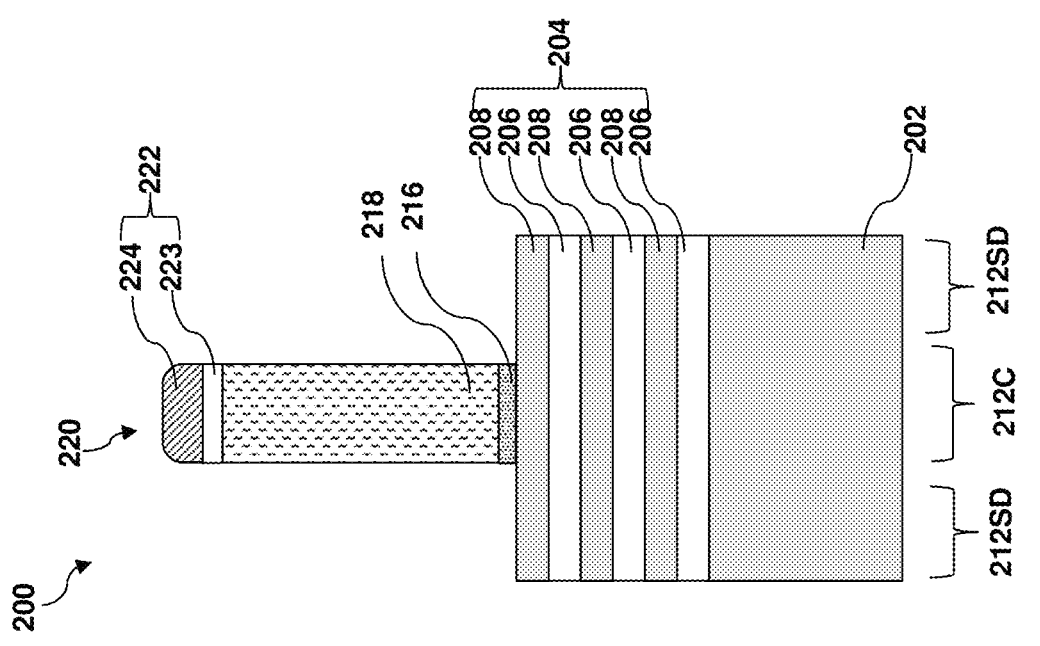

Referring to FIGS. 1, 4 and 5, method 100 includes a block 106 where a dummy gate stack 220 is formed over a channel region 212C of the fin-shaped structure 212. FIG. 4 illustrates a fragmentary cross-sectional view of the workpiece 200 along the lengthwise direction (i.e., X direction) of the fin-shaped structure 212 and FIG. 5 illustrates a fragmentary cross-sectional view of the workpiece 200 along section A-A' in FIG. 4. In other words, FIG. 5 illustrates a fragmentary cross-sectional view of the workpiece 200 along the lengthwise direction (i.e., Y direction) of the dummy gate stack 220. In some embodiments, a gate replacement process (or gate-last process) is adopted where the dummy gate stack 220 (shown in FIGS. 4 and 5) serves as a placeholder to undergo various processes and is to be removed and replaced by the functional gate structure. Other processes and configuration are possible. In some embodiments illustrated in FIG. 5, the dummy gate stack 220 is formed over the fin-shaped structure 212 and the fin-shaped structure 212 may be divided into channel regions 212C underlying the dummy gate stacks 220 and source/drain regions 212SD that do not underlie the dummy gate stacks 220. The channel regions 212C are adjacent the source/drain regions 212SD. As shown in FIG. 5, the channel region 212C is disposed between two source/drain regions 212SD along the X direction.

The formation of the dummy gate stack 220 may include deposition of layers in the dummy gate stack 220 and patterning of these layers. Referring to FIG. 4, a dummy dielectric layer 216, a dummy electrode layer 218, and a gate-top hard mask layer 222 may be deposited or formed over the workpiece 200. In some embodiments, the dummy dielectric layer 216 may be formed on the fin-shaped structure 212 using a chemical vapor deposition (CVD) process, an ALD process, an oxidation process, an oxygen plasma oxidation process, or other suitable processes. In some instances, the dummy dielectric layer 216 may include silicon oxide. Thereafter, the dummy electrode layer 218 may be deposited over the dummy dielectric layer 216 using a CVD process, an ALD process, or other suitable processes. In some instances, the dummy electrode layer 218 may include polysilicon. For patterning purposes, the gate-top hard mask layer 222 may be deposited on the dummy electrode layer 218 using a CVD process, an ALD process, or other suitable processes. The gate-top hard mask layer 222, the dummy electrode layer 218 and the dummy dielectric layer 216 may then be patterned to form the dummy gate stack 220, as shown in FIG. 5. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the gate-top hard mask layer 222 may include a silicon oxide layer 223 and a silicon nitride layer 224 over the silicon oxide layer 223. As shown in FIG. 5, no dummy gate stack 220 is disposed over the source/drain region 212SD of the fin-shaped structure 212.

Figure 6:
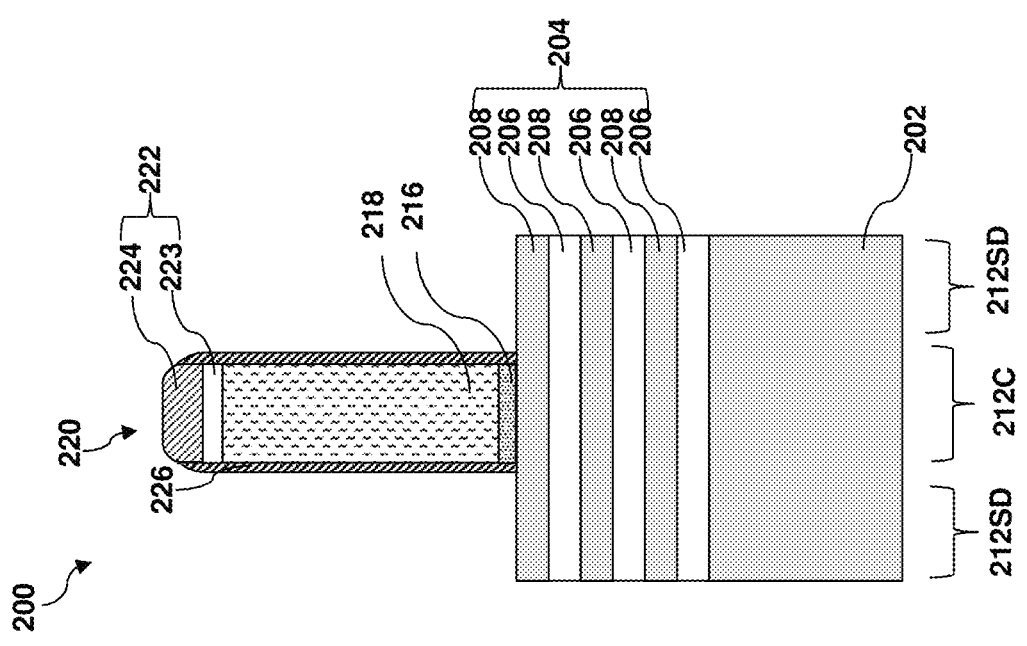

Referring to FIGS. 1 and 6, method 100 includes a block 108 where a gate spacer layer 226 is deposited over the dummy gate stack 220. In some embodiments, the gate spacer layer 226 is deposited conformally over the workpiece 200, including over top surfaces and sidewalls of the dummy gate stack 220. The term "conformally" may be used herein for ease of description of a layer having substantially uniform thickness over various regions. The gate spacer layer 226 may be a single layer or a multi-layer. The at least one layer in the gate spacer layer 226 may include silicon carbonitride, silicon oxycarbide, silicon oxycarbonitride, or silicon nitride. The gate spacer layer 226 may be deposited over the dummy gate stack 220 using processes such as, a CVD process, a subatmospheric CVD (SACVD) process, an ALD process, or other suitable process.

Referring to FIGS. 1 and 7, method 100 includes a block 110 where a source/drain region 212SD of the fin-shaped structure 212 is recessed to form a source/drain trench 228. In some embodiments, the source/drain regions 212SD that are not covered by the dummy gate stack 220 and the gate spacer layer 226 are etched by a dry etch or a suitable etching process to form the source/drain trenches 228. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some embodiments represented in FIG. 7, the source/drain regions 212SD of the fin-shaped structure 212 are recessed to expose sidewalls of the sacrificial layers 206 and the channel layers 208. In some implementations, the source/drain trenches 228 extend below the stack 204 into the substrate 202. FIG. 7 illustrates a cross-sectional view of the workpiece 200 viewed along the Y direction at the source/drain region 212SD. As shown in FIG. 7, the sacrificial layers 206 and channel layers 208 in the source/drain region 212SD are removed at block 110, exposing the substrate 202.

Figure 8:
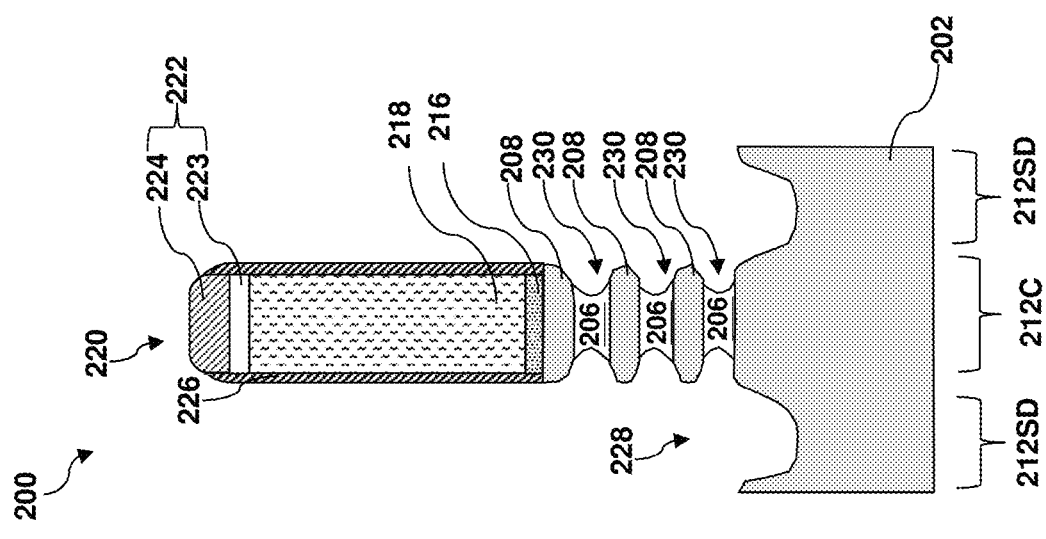

Referring to FIGS. 1, 8, 9, and 10, method 100 includes a block 112 where inner spacer features 234 are formed. While not shown explicitly, operations at block 112 may include selective and partial removal of the sacrificial layers 206 to form inner spacer recesses 230 (shown in FIG. 8), deposition of inner spacer material 232 over the workpiece 200 (shown in FIG. 9), and etch back the inner spacer material 232 to form inner spacer features 234 in the inner spacer recesses 230 (shown in FIG. 10). Referring to FIG. 8, the sacrificial layers 206 exposed in the source/drain trenches 228 are selectively and partially recessed to form inner spacer recesses 230 while the gate spacer layer 226, the exposed portion of the substrate 202, and the channel layers 208 are substantially unetched. In an embodiment where the channel layers 208 consist essentially of silicon (Si) and sacrificial layers 206 consist essentially of silicon germanium (SiGe), the selective recess of the sacrificial layers 206 may be performed using a selective wet etch process or a selective dry etch process. The selective and partial recess of the sacrificial layers 206 may include a SiGe oxidation process followed by a SiGe oxide removal. In that embodiments, the SiGe oxidation process may include use of ozone. In some other embodiments, the selective dry etching process may include use of one or more fluorine-based etchants, such as fluorine gas or hydrofluorocarbons. The selective wet etching process may include an APM etch (e.g., ammonia hydroxide-hydrogen peroxide-water mixture).

Figure 9:
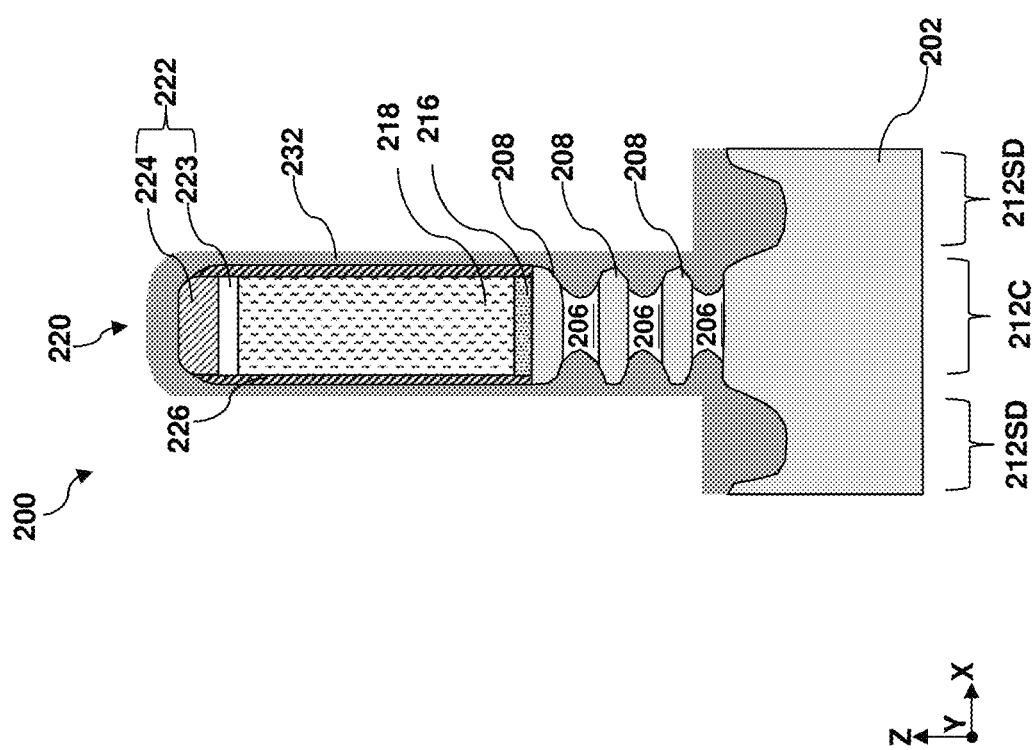
Figure 10:
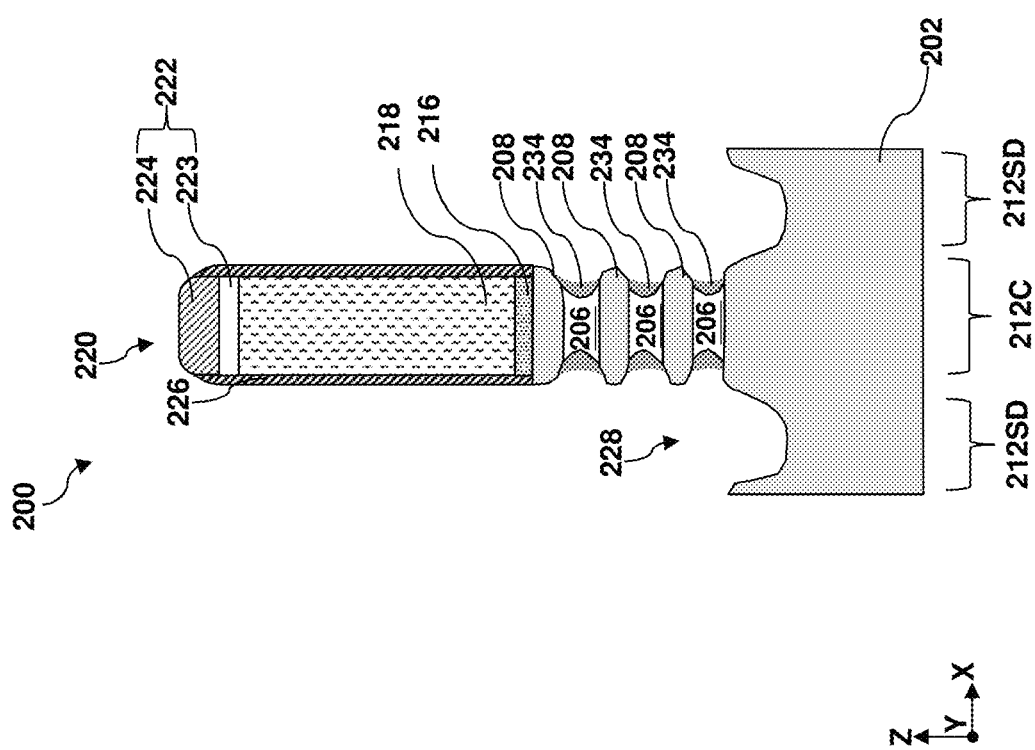

After the inner spacer recesses 230 are formed, the inner spacer material 232 is deposited over the workpiece 200, including over the inner spacer recesses 230, as shown in FIG. 9. The inner spacer material 232 may include metal oxides, silicon oxide, silicon oxycarbonitride, silicon nitride, silicon oxynitride, carbon-rich silicon carbonitride, or a low-k dielectric material. The metal oxides may include aluminum oxide, zirconium oxide, tantalum oxide, yttrium oxide, titanium oxide, lanthanum oxide, or other suitable metal oxide. While not explicitly shown, the inner spacer material 232 may be a single layer or a multilayer. In some implementations, the inner spacer material 232 may be deposited using CVD, PECVD, SACVD, ALD or other suitable methods. The inner spacer material 232 is deposited into the inner spacer recesses 230 as well as over the sidewalls of the channel layers 208 exposed in the source/drain trenches 228. Referring to FIG. 10, the deposited inner spacer material 232 is then etched back to remove the inner spacer material 232 from the sidewalls of the channel layers 208 to form the inner spacer features 234 in the inner spacer recesses 230. At block 112, the inner spacer material 232 may also be removed from the top surfaces and/or sidewalls of the gate-top hard mask layer 222 and the gate spacer layer 226. In some implementations, the etch back operations performed at block 112 may include use of hydrogen fluoride (HF), fluorine gas ($F_2$), hydrogen ($H_2$), ammonia ($NH_3$), nitrogen trifluoride ($NF_3$), or other fluorine-based etchants. As shown in FIG. 10, each of the inner spacer features 234 is in direct contact with the recessed sacrificial layers 206 and is disposed between two neighboring channel layers 208. As shown in FIG. 10, while the selective etch process and etch back process at block 112 are selective to the sacrificial layers 206 and the inner spacer material 232, the channel layers 208 may be moderately etched and have rounded ends.

Figure 11:
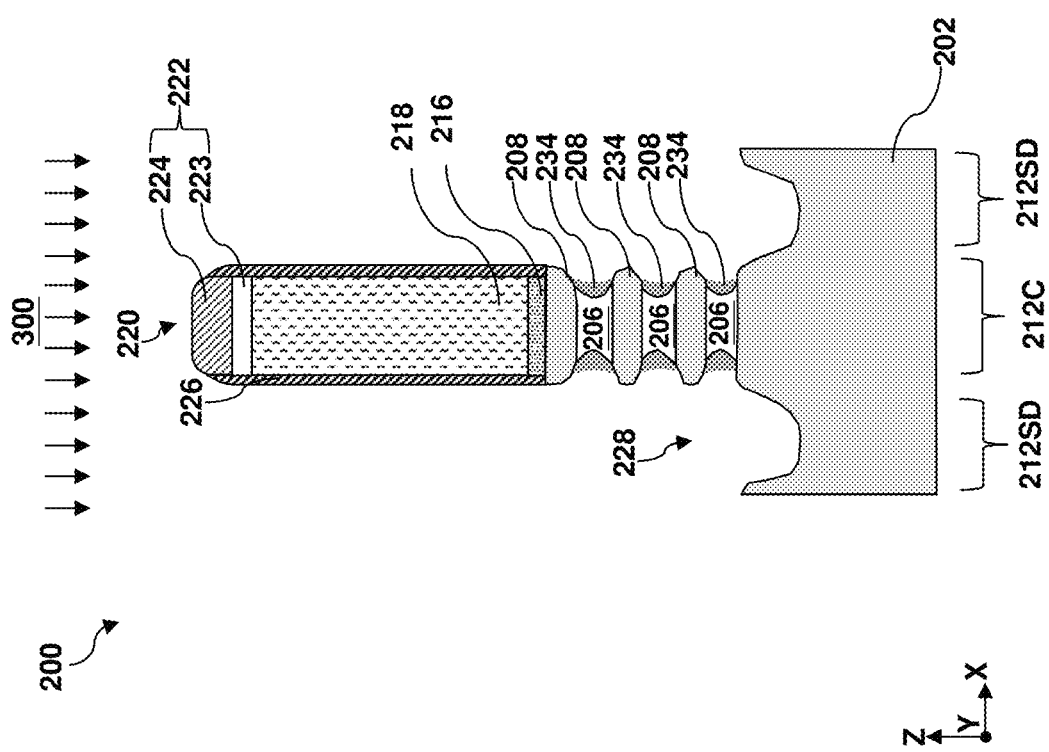

Referring to FIGS. 1, 11, 12, and 13, method 100 includes a block 114 where source/drain features 236 are formed. Operations at block 114 may include a cleaning process 300 to remove contamination, oxide, and debris (shown in FIG. 11), deposition of the source/drain features 236 in the source/drain trenches (shown in FIG. 12), annealing of the source/drain features 236 (shown in FIG. 13). Reference is first made to FIG. 11, a cleaning process 300 is performed at block 114. The cleaning process 300 may include a dry clean, a wet clean, or a combination thereof. In some examples, the wet clean may include use of standard clean 1 (RCA SC-1, a mixture of deionized (DI) water, ammonium hydroxide, and hydrogen peroxide), standard clean 2 (RCA SC-2, a mixture of DI water, hydrochloric acid, and hydrogen peroxide), SPM (a sulfuric peroxide mixture), and or hydrofluoric acid for oxide removal. The dry clean process may include helium (He) and hydrogen ($H_2$) treatment. The hydrogen treatment may convert silicon on the surface to silane ($SiH_4$), which may be pumped out for removal. In some implementations, the cleaning process is configured to selectively remove or trim a portion of the channel layers without substantially removing the inner spacer features 234. The cleaning process 300 may remove surface oxide and debris in order to ensure a clean semiconductor surface, which facilitates growth of high quality epitaxial layers.

Figure 12:
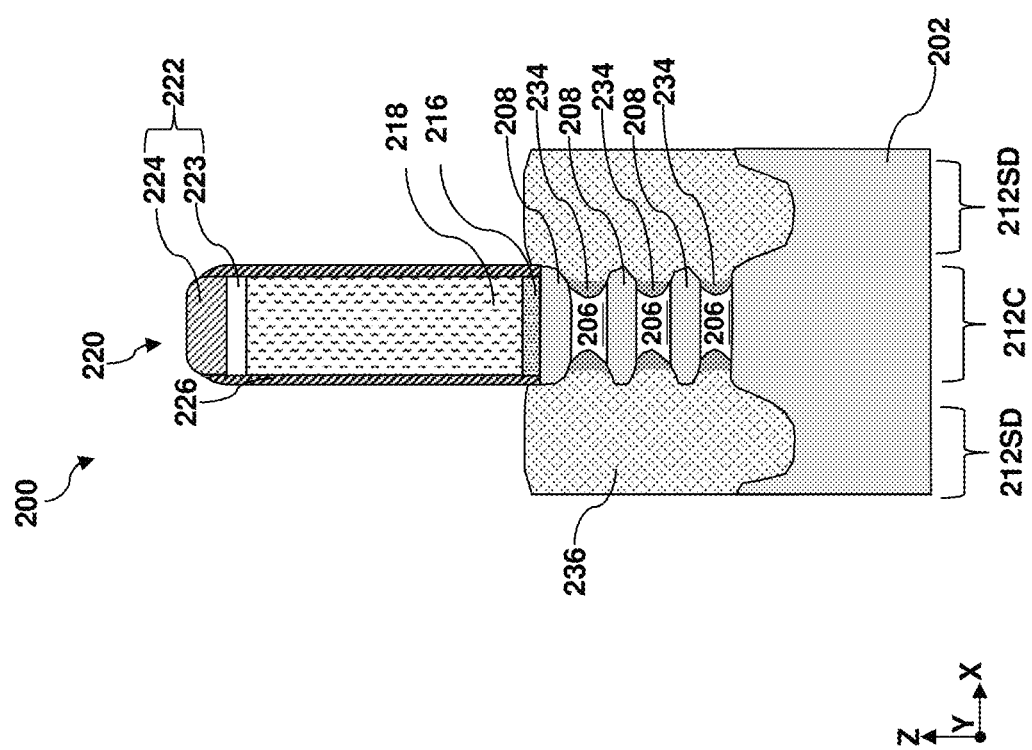

Reference is then made to FIG. 12, the source/drain features 236 are deposited. The composition of the source/drain features 236 depends on the conductivity type of the to-be-formed MBC transistor. When the to-be-formed MBC transistor is n-type, the source/drain features 236 may include silicon (Si) doped with an n-type dopant, such as phosphorus (P) or arsenic (As). When the to-be-formed MBC transistor is p-type, the source/drain features 236 may include silicon germanium (SiGe) doped with a p-type dopant, such as boron (B), boron difluoride ($BF_2$), or gallium (Ga). In some implementations represented in FIG. 12, the source/drain features 236 may be epitaxially and selectively formed from the exposed sidewalls of the channel layers 208 and exposed surfaces of the substrate 202 while sidewalls of the sacrificial layers 206 remain covered by the inner spacer features 234. Suitable epitaxial processes for block 114 include vapor-phase epitaxy (VPE), ultra-high vacuum CVD (UHV-CVD), molecular beam epitaxy (MBE), and/or other suitable processes. The epitaxial growth process at block 114 may use gaseous precursors, which interact with the composition of the substrate 202 as well as the channel layers 208. In some embodiments, parameters of the epitaxial growth process at block 114 are selected such that the source/drain features 236 are not epitaxially deposited on the inner spacer features 234.

While not explicitly illustrated, each of the source/drain features 236 may include more than one epitaxial layers. In one embodiment, the source/drain feature 236 may include a first epitaxial layer ($L_0$) with low dopant levels to reduce interface dislocation, a second epitaxial layer ($L_1$) with high dopant levels to exert strain and to reduce contact resistance, and a third epitaxial layer ($L_2$) with moderate dopant levels to serve as an etch-resistant protective layer. For example, when the source/drain features 236 are n-type, the n-type dopant concentration in the second epitaxial layer is greater than the n-type dopant concentration in the third epitaxial layer and the n-type dopant concentration in the third epitaxial layer is greater than the n-type dopant concentration in the first epitaxial layer. When the source/drain features 236 are p-type, the p-type dopant concentration in the second epitaxial layer is greater than the p-type dopant concentration in the third epitaxial layer and the p-type dopant concentration in the third epitaxial layer is greater than the p-type dopant concentration in the first epitaxial layer. Additionally, when the source/drain features 236 are p-type, the germanium content in the second epitaxial layer is greater than the germanium content in the third epitaxial layer and the germanium content in the third epitaxial layer is greater than the germanium content in the first epitaxial layer.

Figure 13:
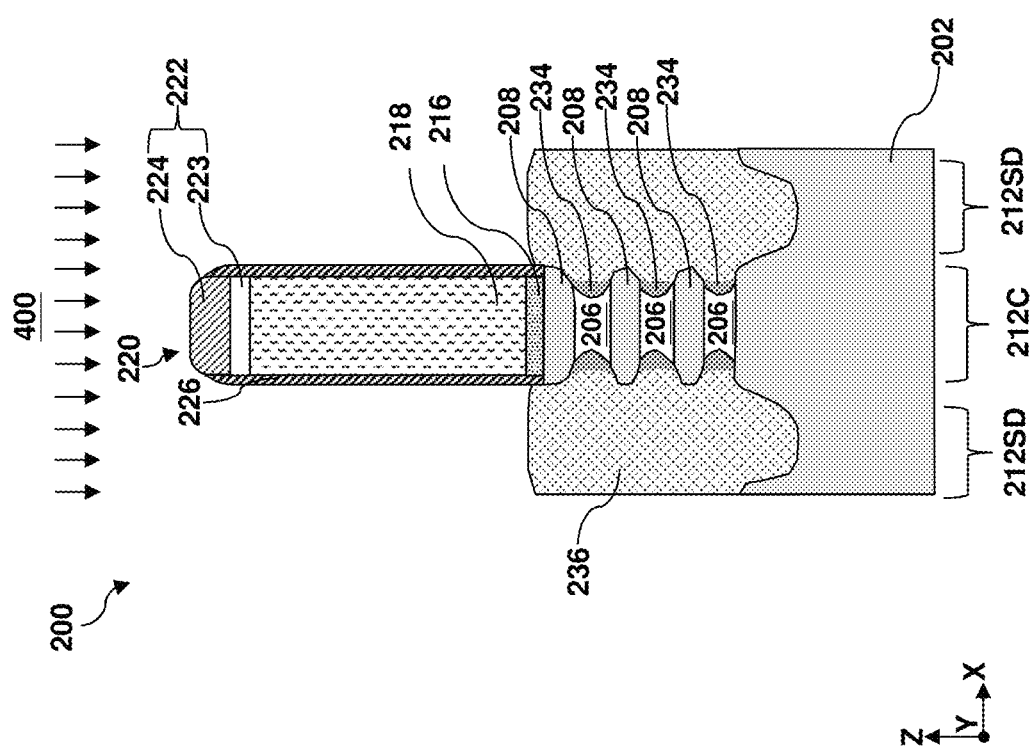

Referring to FIG. 13, after the deposition of the source/drain features 236, block 114 may include an anneal process 400 to activate the source/drain features 236. In some implementation, the anneal process 400 may include a rapid thermal anneal (RTA) process, a laser spike anneal process, a flash anneal process, or a furnace anneal process. The anneal process 400 may include a peak anneal temperature between about 900° C. and about 1000° C. In these implementations, the peak anneal temperature may be maintained for a duration measured by seconds or microseconds. Through the anneal process 400, a desired electronic contribution of the p-type dopant in the semiconductor host, such as silicon germanium (SiGe) or germanium (Ge), may be obtained. The anneal process 400 may generate vacancies that facilitate movement of the p-type dopant from interstitial sites to substitutional lattice sites and reduce damages or defects in the lattice of the semiconductor host.

Figure 14:
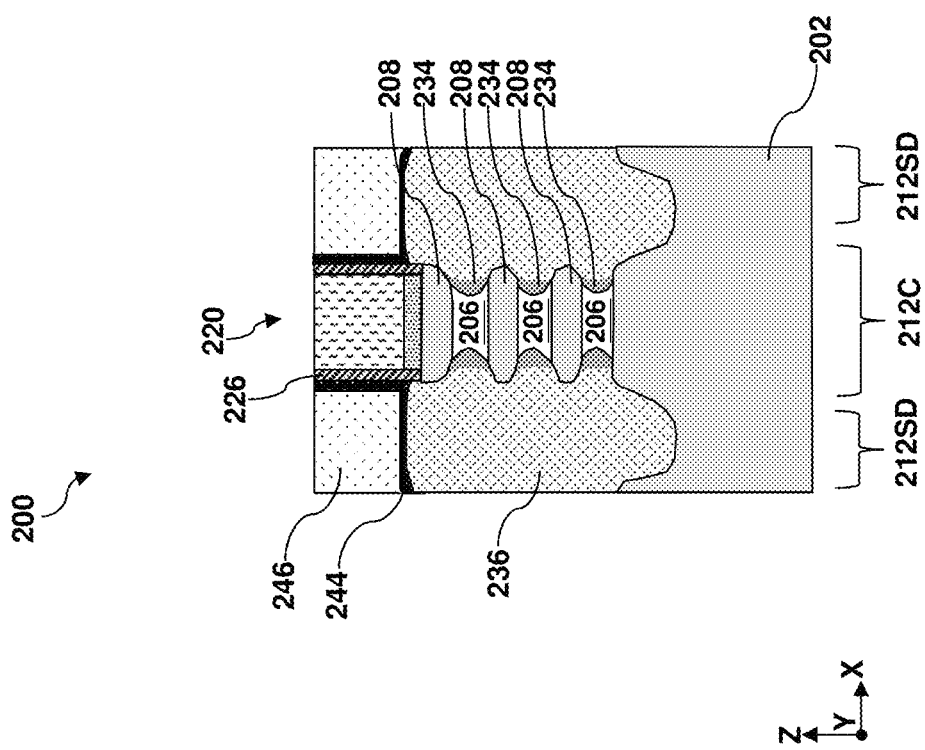

Referring to FIGS. 1 and 14, method 100 includes a block 116 where a contact etch stop layer (CESL) 244 and an interlayer dielectric (ILD) layer 246 are deposited. The CESL 244 is formed prior to forming the ILD layer 246. In some examples, the CESL 244 includes silicon nitride, silicon oxynitride, and/or other materials known in the art. The CESL 244 may be formed by ALD, plasma-enhanced chemical vapor deposition (PECVD) process and/or other suitable deposition processes. The ILD layer 246 is then deposited over the CESL 244. In some embodiments, the ILD layer 246 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 246 may be deposited by a PECVD process or other suitable deposition technique. In some embodiments, after formation of the ILD layer 246, the workpiece 200 may be annealed to improve integrity of the ILD layer 246. As shown in FIG. 14, the CESL 244 may be disposed directly on top surfaces of the source/drain feature 236.

Figure 15:
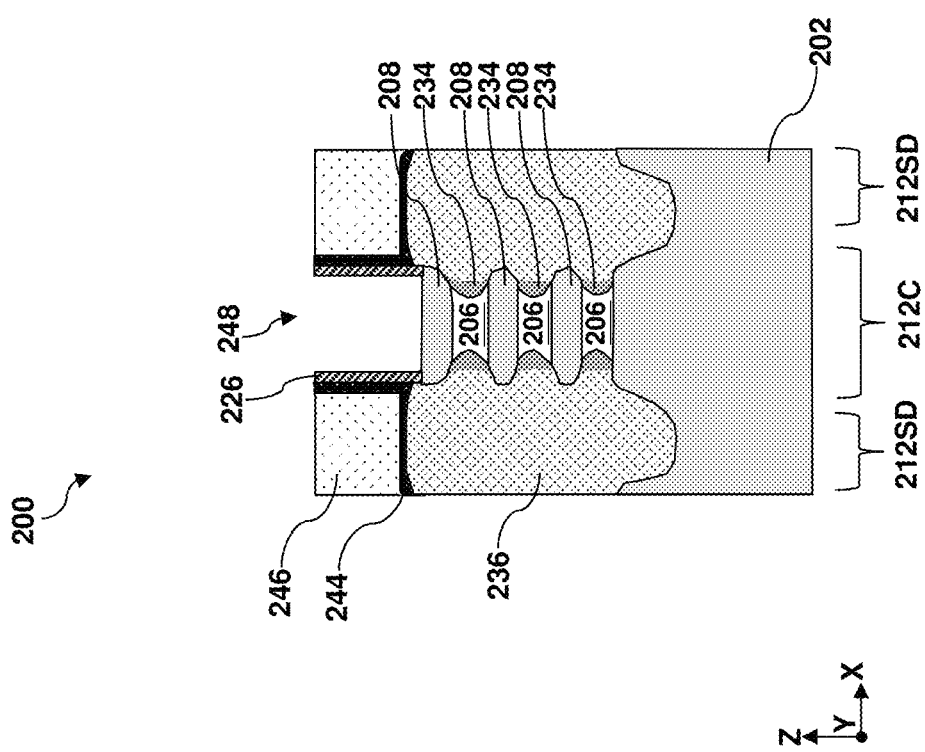

Referring to FIGS. 1 and 15, method 100 includes a block 118 where the dummy gate stack 220 is removed. After the deposition of the CESL 244 and the ILD layer 246, the workpiece 200 may be planarized by a planarization process to expose the dummy gate stack 220. For example, the planarization process may include a chemical mechanical planarization (CMP) process. Exposure of the dummy gate stack 220 allows the removal of the dummy gate stack 220 and release of the channel layers 208, illustrated in FIG. 16. In some embodiments, the removal of the dummy gate stack 220 results in a gate trench 248 over the channel regions 212C. The removal of the dummy gate stack 220 may include one or more etching processes that are selective to the material of the dummy gate stack 220. For example, the removal of the dummy gate stack 220 may be performed using as a selective wet etch, a selective dry etch, or a combination thereof that is selective to the dummy gate stack 220. After the removal of the dummy gate stack 220, sidewalls of the channel layers 208 and the sacrificial layers 206 in the channel region 212C are exposed in the gate trench 248.

Figure 16:
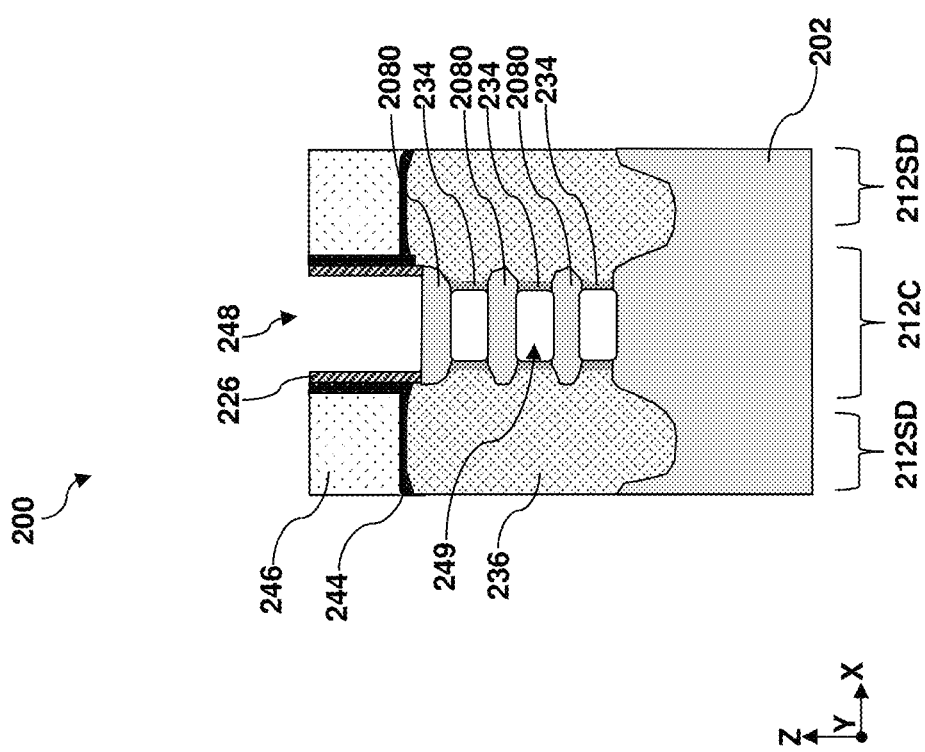

Referring to FIGS. 1 and 16, method 100 includes a block 120 where the sacrificial layers 206 in the channel region 212C are selectively removed to release the channel layers 208 as channel members 2080. After the removal of the dummy gate stack 220, the sacrificial layers 206 between the channel layers 208 in the channel region 212C are exposed. The selective removal of the sacrificial layers 206 releases the channel layers 208 in FIG. 15 to form channel members 2080 shown in FIG. 16. The selective removal of the sacrificial layers 206 also leaves behind space 249 between channel members 2080. The selective removal of the sacrificial layers 206 may be implemented by selective dry etch, selective wet etch, or other selective etch processes. An example selective dry etching process may include use of one or more fluorine-based etchants, such as fluorine gas or hydrofluorocarbons. An example selective wet etching process may include an APM etch (e.g., ammonia hydroxide-hydrogen peroxide-water mixture).

Figure 17:
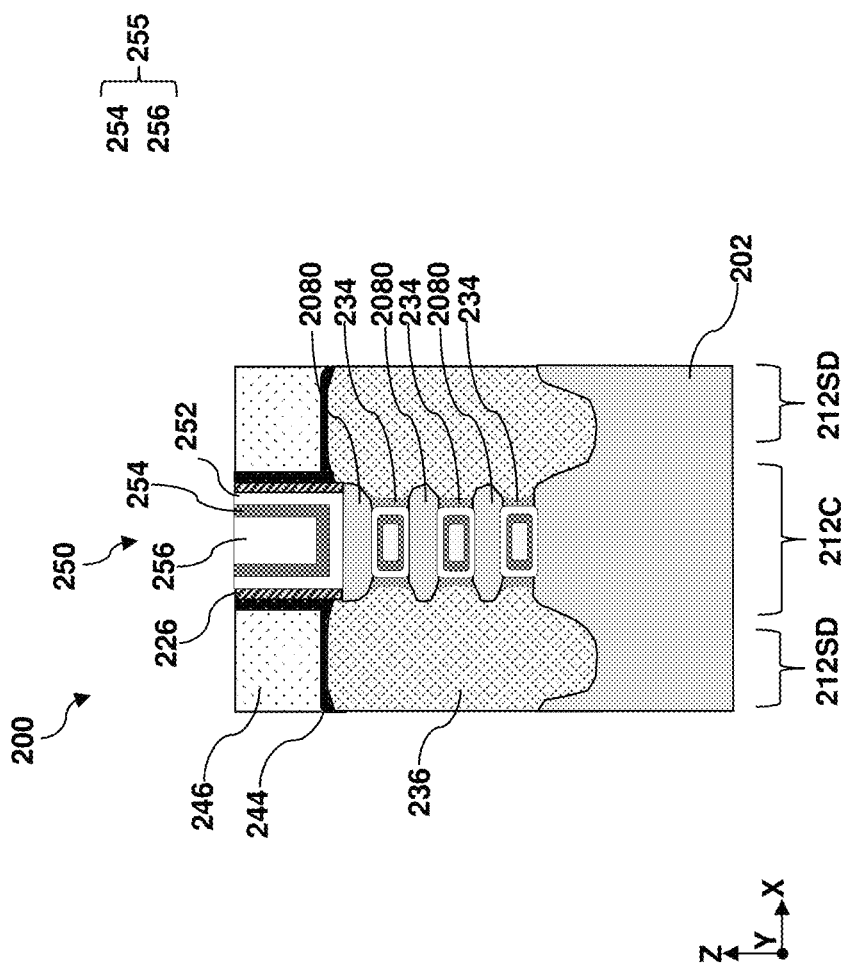

Referring to FIGS. 1 and 17, method 100 includes a block 122 where gate stack layers are deposited in the gate trench 248 and the space 249 to wrap around each of the channel members 2080. As shown in FIG. 17, the gate stack layers deposited at block 122 may include a gate dielectric layer 252 and at least one work function layer 255. The gate stack layers shown in FIG. 17 may be collectively referred to as a gate structure 250. While not explicitly shown in the figures, the gate dielectric layer 252 includes an interfacial layer and a high-K gate dielectric layer. High-K dielectric materials, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer may include hafnium oxide. Alternatively, the high-K gate dielectric layer may include other high-K dielectric materials, such as titanium oxide (TiO$_2$), hafnium zirconium oxide (HfZrO), tantalum oxide (Ta$_2$O$_5$), hafnium silicon oxide (HfSiO$_4$), zirconium oxide (ZrO$_2$), zirconium silicon oxide (ZrSiO$_2$), lanthanum oxide (La$_2$O$_3$), aluminum oxide (Al$_2$O$_3$), zirconium oxide (ZrO), yttrium oxide (Y$_2$O$_3$), SrTiO$_3$ (STO), BaTiO$_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)TiO$_3$ (BST), silicon nitride (SiN), silicon oxynitride (SiON), combinations thereof, or other suitable material. The high-K gate dielectric layer may be formed by ALD, physical vapor deposition (PVD), CVD, oxidation, and/or other suitable methods.

The at least one work function layer 255 are selected to adjust the threshold voltage of the MBC transistor for performance enhancement or to conform with the design of the circuit. The at least one work function layer 255 may include titanium nitride (TiN), titanium aluminum (TiAl), titanium aluminum nitride (TiAlN), titanium aluminum carbide (TiAlC), tantalum nitride (TaN), tungsten nitride (WN), tungsten carbonitride (WCN), tantalum aluminum (TaAl), tantalum aluminum nitride (TaAlN), tantalum aluminum carbide (TaAlC), tantalum carbonitride (TaCN), aluminum (Al), tantalum carbide (TaC), tantalum silicon nitride (Ta- SiN), titanium silicon nitride (TiSiN), silver (Ag), manganese (Mn), zirconium (Zr), or a combination thereof.

The construction or stacking of the at least one work function layer 255 may vary according to the conductivity type of the MBC transistor. When the MBC transistor is n-type and the at least one work function layer 255 includes a first work function layer 254 and a second work function layer 256, the first work function layer 254 may be an n-type work function layer and the second work function layer 256 may be a p-type work function layer. The n-type work function layer may be an aluminum-containing layer and may include titanium (Ti), aluminum (Al), silver (Ag), manganese (Mn), zirconium (Zr), tantalum aluminum carbide (TaAlC), tantalum carbide (TaC), tantalum carbonitride (TaCN), tantalum aluminum (TaAl), titanium aluminum nitride (TiAlN), or a combination thereof. In one embodiment, the n-type work function layer (i.e., the first work function layer 254 of the n-type MBC transistor) may include titanium aluminum nitride (TiAlN) and the p-type work function layer (i.e., the second work function layer 256 of the n-type MBC transistor) may include titanium nitride (TiN). The first work function layer 254 is closer to the channel members 2080 than the second work function layer 256. When the MBC transistor is p-type and the at least one work function layer 255 includes a first work function layer 254 and a second work function layer 256, both the first work function layer 254 and the second work function layer 256 are p-type work function layers that may include titanium nitride (TiN), tantalum nitride (TaN), tungsten nitride (WN), tungsten carbonitride (WCN), tantalum silicon nitride (TaSiN), titanium silicon nitride (TiSiN), or a combination thereof. In one embodiment, the first work function layer 254 of the p-type MBC transistor may include tantalum nitride (TaN) and the second work function layer 256 of the p-type MBC transistor may include titanium nitride (TiN). The first work function layer 254 is closer to the channel members 2080 than the second work function layer 256. In various embodiments, the at least one work function layer 255 may be formed by ALD, PVD, CVD, e-beam evaporation, or other suitable process. In various embodiments, a CMP process may be performed to remove excessive metal, thereby providing a substantially planar top surface of the gate structure 250. According to the present disclosure, when n-type MBC transistors and p-type MBC transistors are fabricated on the same substrate, a portion of the at least one work function layer 255 for the n-type MBC transistors and p-type MBC transistors may be formed separately while another portion of the at least one work function layer 255 may be formed simultaneously. As will be described below, adjacent n-type and p-type gate structures may share a common work function layer, such as the second work function layer 256 shown in FIG. 17. In one embodiment, the second work function layer 256 may include titanium nitride (TiN).

Figure 18:
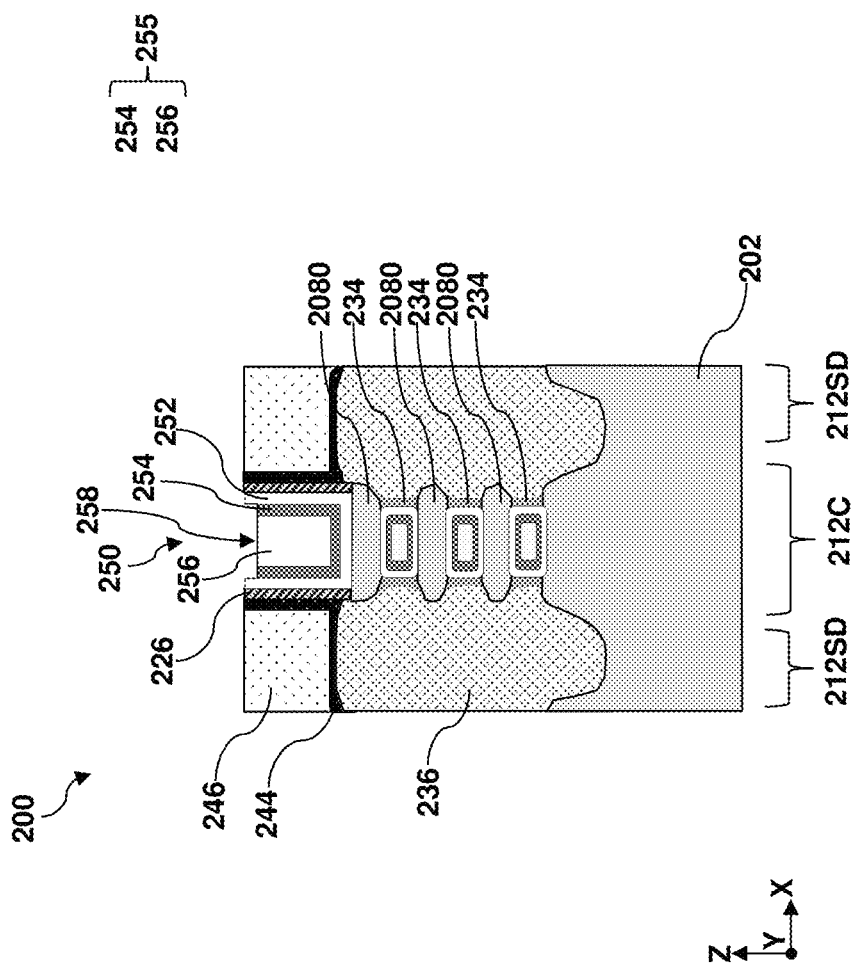
Figure 19:
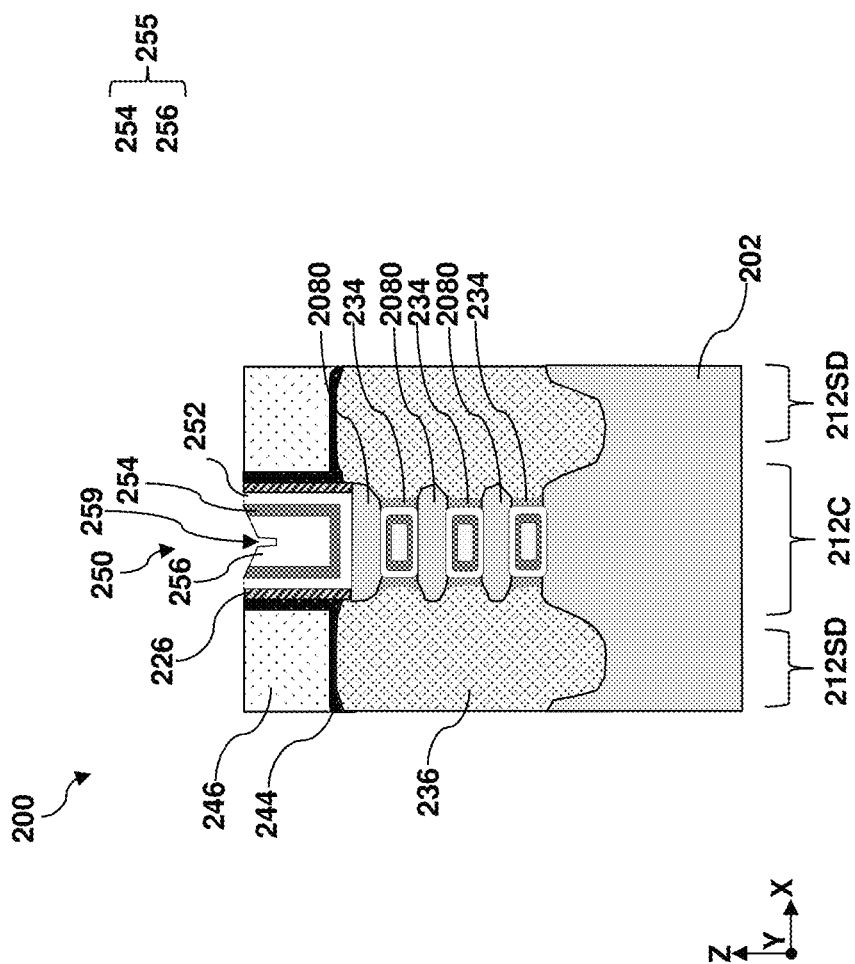

Referring to FIGS. 1, 18 and 19, method 100 includes a block 124 where gate stack layers deposited at block 122 are etched back. In some embodiments, the gate stack layers, including at least one work function layer 255, may be etched back using thermal atomic layer etching (ALE), dry etching, wet clean, or a combination thereof. An example ALE process may include an oxidizer, such as ozone (03) or hydrogen peroxide ($H_2O_2$), and hydrogen fluoride (HF). An example dry etching process may include a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), oxygen ($O_2$), diazene ($N_2H_2$), argon (Ar), or a combination thereof. An example wet clean process may include use of ammonium hydroxide ($NH_4OH$), hydrogen peroxide ($H_2O_2$), hot deionized water (DI water), isopropyl alcohol (IPA), or ozone ($O_3$). In one embodiment, the etch back at block 124 may include a dry etch process followed by a wet etch process. In that embodiment, the dry etch process may include use of $CF_4$, $Cl_2$, $BCl_3$), oxygen ($O_2$), diazene ($N_2H_2$), and argon (Ar) and the wet clean process may include use of ammonium hydroxide ($NH_4OH$), hydrogen peroxide ($H_2O_2$), hot deionized water (DI water), isopropyl alcohol (IPA), and ozone-deionized water ($O_3$-DI) ($O_3$).

Depending on the selectivity of the etch back process at block 124, the gate structure 250 may have different top profiles. Referring to FIG. 18, when the etch back process is homogeneous among the at least one work function layer 255, a recess 258 may be formed over the gate structure 250. As shown in FIG. 18, the recess 258 is defined between two sidewalls of the gate dielectric layer 252 and a bottom surface of the recess 258 is substantially planar. Reference is then made to FIG. 19. when the etch back process is selective to the second work function layer 256 of the at least one work function layer 255, a dent 259 may be formed into the second work function layer 256 over the gate structure 250. As shown in FIG. 19, when viewed along Y direction, the dent 259 may include a lower vertical portion extending into the second work function layer 256 and an upper horizontal portion spanning over the top surfaces of the first work function layer 254.

Figure 20:
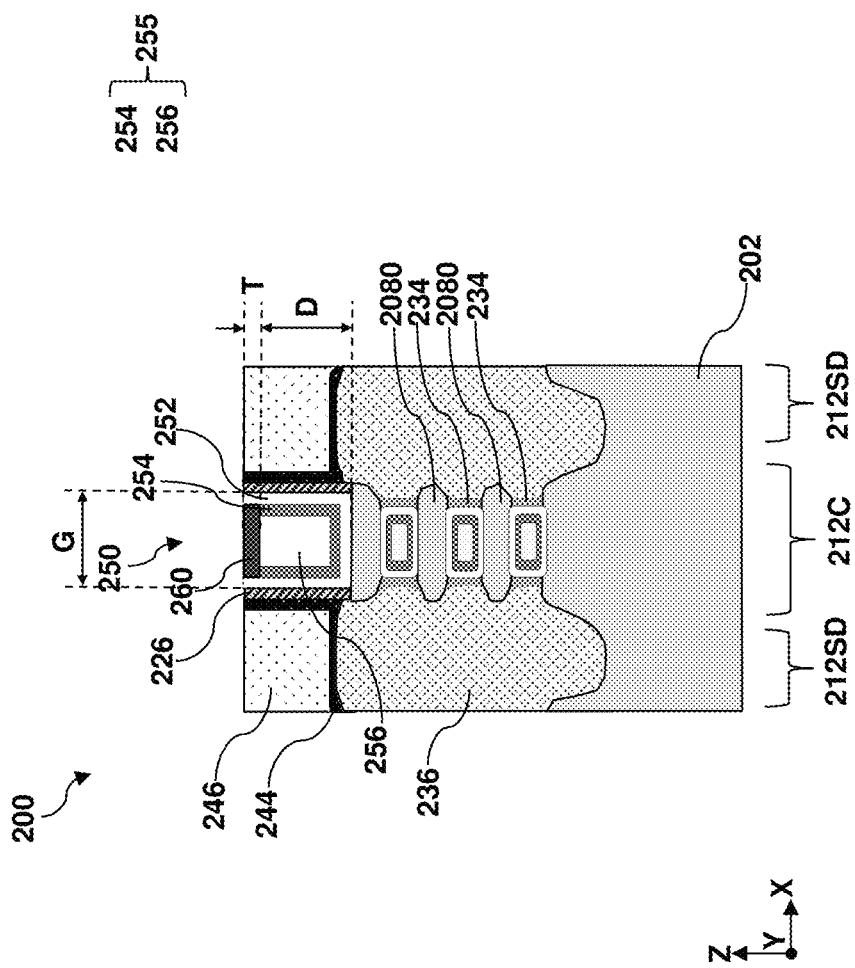
Figure 21:
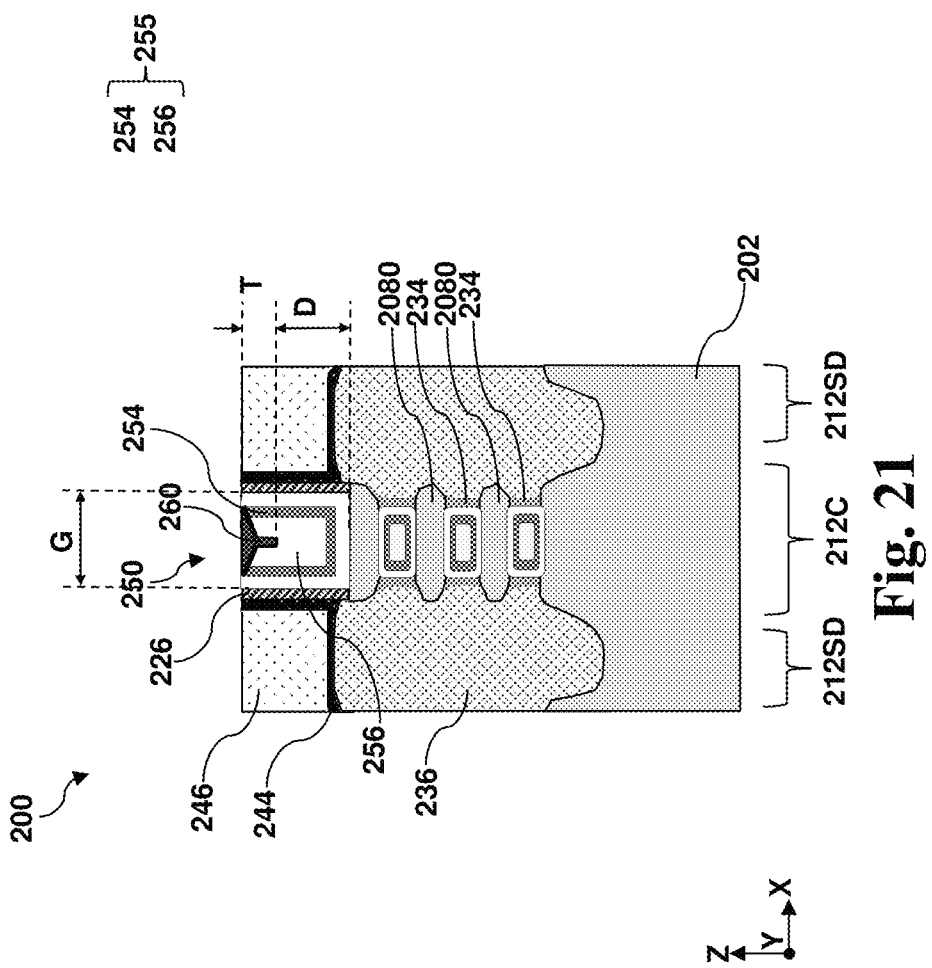

Referring to FIGS. 1, 20 and 21, method 100 includes a block 126 where a gate cap layer 260 is deposited over the etched back gate structure 250. In some embodiments, the gate cap layer 260 may include tungsten (W), cobalt (Co), nickel (Ni), or ruthenium (Ru) and may be deposited using atomic layer deposition (ALD) that allows selective deposition of the gate cap layer 260 on the at least one work function layer 255. In one embodiment, the gate cap layer 260 may be formed of tungsten (W) as it is compatible with subsequent processes, such as processes associated with formation of self-aligned contact (SAC) structures. As shown in FIGS. 20 and 21, a distance D between a bottom surface of the gate cap layer 260 to a top surface of the topmost channel member 2080 may be between 10 nm and about 20 nm and a gate length G of the gate structure 250 may be between about 6 nm and about 50 nm. The gate length G of the present disclosure is meaningful. When the gate length G is greater than 50 nm, such as 60 nm, the size of the gate structure allows deposition of one or more metal fill layers over the at least one work function layer to reduce gate resistance. When the gate length G is smaller than about 10 nm, such as between about 6 nm and about 8 nm in the present disclosure, satisfactory deposition of a metal fill layer over the at least one work function layer may be impractical and the gate cap layer 260 of the present disclosure comes into play and functions to reduce gate resistance.

Referring still to FIGS. 20 and 21, the gate cap layer 260 formed at block 126 may have a thickness T between about 2 nm and about 5 nm. This thickness range is not trivial. Because the material of the gate cap layer 260 is more conductive than the material of the at least one work function layer, theoretically it is advantageous to etch back more of the at least one work function layer 255 and form the gate cap layer 260 to a greater thickness. It is observed that 2 nm is the minimum thickness of the gate cap layer 260 to ensure benefits of the gate cap layer 260. However, while the deposition of the gate cap layer 260 is selective to the at least one work function layer 255, overgrowth of the gate cap layer 260 may extend over the gate dielectric layer 252 or even over the gate spacer layer 226, leading to undesired leakage or shorts. It is observed that when the gate cap layer 260 is greater than 5 nm, overgrowth of the gate cap layer 260 is more likely to result in leakage or shorts.

The shape of the Y-direction cross-section of the gate cap layer 260 depends on the profile of the gate structure 250 after the operations at block 124. Referring to FIG. 20, when the recess 258 (shown in FIG. 18) is formed at block 124, the gate cap layer 260 generally tracks the shape of the recess 258 and resembles a sheet. Reference is then made to FIG. 21, when the dent 259 (shown in FIG. 19) is formed at block 124, the gate cap layer 260 generally tracks the shape of the dent 259 and has a T shape. As shown in FIG. 21, the T shape of the gate cap layer 260 includes a lower vertical portion and an upper horizontal portion. While the upper horizontal portion spans over the at least one work function layer 255, the lower vertical portion extends partially into the second work function layer 256. The implementation of the gate cap layer 260 conveys benefits. Compared to a gate structure without the gate cap layer 260, the implementation of the gate cap layer 260 may reduce the gate sheet resistance (sheet resistance associated with the gate structure 250) by about an order of magnitude, from 1000 ohm/square to about 50 to 100 ohm/square. When tested using a ring oscillator structure, implementation of the gate cap layer 260 is shown to improve the performance of the MBC transistor by about 3% to about 5%, compared to a similar MBC transistor without the gate cap layer 260.

Figure 22:
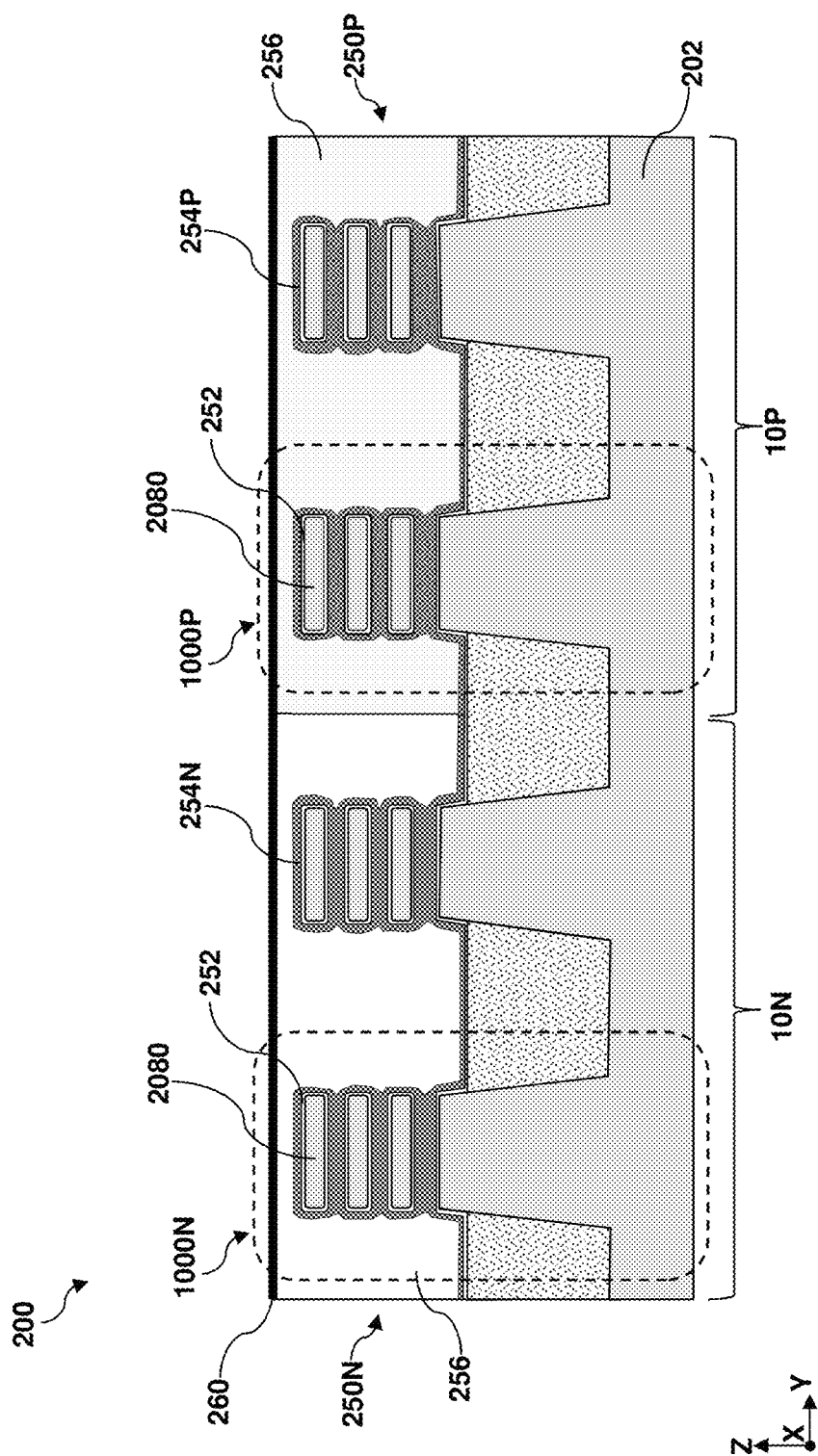
FIG. 22 illustrate a gate cap layer spanning over an n-type device region and p-type device region, according to one or more aspects of the present disclosure.

Reference is then made to FIGS. 22-26. In some embodiments, the gate cap layer 260 may be disposed on a gate structure of an n-type MBC transistor and a gate structure of a p-type MBC transistor to directly couple the n-type MBC transistor and the p-type MBC transistor, when the circuit design calls for such local connection. Referring to FIG. 22, the workpiece 200 may include an n-type device region 10N and a p-type device region 10P adjacent the n-type device region 10N. The n-type device region 10N may include at least one n-type MBC transistor 1000N and the p-type device region 10P may include at least one p-type MBC transistor 1000P. The n-type MBC transistor 1000N includes a first gate structure 250N that wraps around a first vertical stack of channel members 2080 in the n-type device region 10N. The p-type MBC transistor 1000P includes a second gate structure 250P that wraps around a second vertical stack of channel members 2080 in the p-type device region 10P. The first gate structure 250N may include an n-type work function layer 254N and the second gate structure 250P may include p-type work function layer 254P. Example compositions of the n-type work function layer 254N and the p-type work function layer 254P are described above with respect to the at least one work function layer 255. In the depicted embodiment, the n-type work function layer 254N includes titanium aluminum nitride (TiAlN) and the p-type work function layer 254P includes tantalum nitride (TaN). As shown in FIG. 22, the n-type work function layer 254N may come in direct contact with the p-type work function layer 254P at the junction between the n-type device region 10N and the p-type device region 10P (or between an n-type MBC transistor 1000N and a p-type MBC transistor 1000P). The gate cap layer 260 extends continuously from over the n-type device region 10N to over the p-type device region 10P to reduce the gate resistance between first gate structure 250N and the second gate structure 250P along the Y direction. The first gate structure 250N and the second gate structure 250P also include a common p-type work function layer 256. In one embodiment, the common p-type work function layer 256 may include titanium nitride (TiN). In some embodiment represented in FIG. 22, the gate cap layer 260 may span over both the first gate structure 250N and the second gate structure 250P to electrically coupled them for local interconnection purposes. That is, the first gate structure 250N and the second gate structure 250P may be electrically coupled by the gate cap layer 260. In FIG. 22, the first gate structure 250N and the second gate structure 250P extend lengthwise along the X direction. With respect to the first gate structure 250N, the n-type work function layer 254N corresponds to the aforementioned first work function layer 254 and the common p-type work function layer 256 corresponds to the aforementioned second work function layer 256. With respect to the second gate structure 250P, the p-type work function layer 254P corresponds to the aforementioned first work function layer 254 and the common p-type work function layer 256 corresponds to the aforementioned second work function layer 256.

The Y-direction cross-sectional views of the n-type MBC transistor 1000N are shown in FIGS. 23 and 25, respectively. The Y-direction cross-sectional views of the p-type MBC transistor 1000P are illustrated in FIGS. 24 and 26, respectively. In some embodiments, the gate cap layer 260 in FIGS. 23 and 24 is formed in a recess similar to the recess 258 shown in FIG. 18 and may have a sheet-like shape over the first gate structure 250N and the second gate structure 250P. In some other embodiments, the gate cap layer 260 in FIGS. 25 and 26 is formed in a dent similar to the dent 259 shown in FIG. 19 and may have a T-shaped cross section over the first gate structure 250N and the second gate structure 250P. Similar to the structure shown in FIG. 20, the T shape of the gate cap layer 260 includes a lower vertical portion that extends partially into the common p-type work function layer 256 of the first gate structure 250N and the second gate structure 250P. The channel members 2080 of the n-type MBC transistor 1000N extend between two n-type source/drain features 236N along the X direction. The channel members 2080 of the p-type MBC transistor 1000P extend between two p-type source/drain features 236P along the X direction. Example n-type source/drain features and p-type source/drain features are described above with respect the source/drain feature 236.

Although not intended to be limiting, one or more embodiments of the present disclosure provide many benefits to a semiconductor device. For example, embodiments of the present disclosure provide MBC transistors that include a gate structure that wraps around a vertical stack of channel members. The gate structure includes a gate dielectric layer and at least one work function layer. A tungsten gate cap layer is formed over the gate structure after the gate structure is etched back. The implementation of the tungsten gate cap layer may reduce the resistance associated with the gate structure by about one order of magnitude and boost the device performance by about 3% to about 5%.

In one exemplary aspect, the present disclosure is directed to a semiconductor device. The semiconductor device includes a first plurality of channel members being vertically stacked, a second plurality of channel members being vertically stacked, an n-type work function layer wrapping around each of the first plurality of channel members, a first p-type work function layer over the n-type work function layer and wrapping around each of the first plurality of channel members, a second p-type work function layer wrapping around each of the second plurality of channel members, a third p-type work function layer over the second p-type work function layer and wrapping around each of the second plurality of channel members, and a gate cap layer over a top surface of the first p-type work function layer and a top surface of the third p-type work function layer such that the gate cap layer electrically couples the first p-type work function layer and the third p-type work function layer.

In some embodiments, the n-type work function layer includes Ti, Al, Ag, Mn, Zr, TiAl, TiAlC, TaC, TaCN, TaAl, TaAlC, TiAlN, or a combination thereof. In some implementations, the n-type work function layer includes TiAlN. In some instances, the first p-type work function layer and the third p-type work function layer include TiN. In some embodiments, the second p-type work function layer includes TaN. In some embodiments, the gate cap layer includes tungsten. In some instances, the first plurality of channel members extend between two n-type source/drain features along a direction and the second plurality of channel members extend between two p-type source/drain features along the direction. In some embodiments, when viewed along the direction, a cross section of the gate cap layer includes a T-shape. In some embodiments, the cross section of the gate cap layer includes a lower vertical portion and an upper horizontal portion and the lower vertical portion extends into the first p-type work function layer and the third p-type work function layer. In some embodiments, the gate cap layer includes a thickness between 2 nm and about 5 nm.

In another exemplary aspect, the present disclosure is directed to a semiconductor structure. The semiconductor structure includes a first source/drain feature and a second source/drain feature, a plurality of channel members extending between the first source/drain feature and the second source/drain feature along a direction, a gate structure wrapping around each of the plurality of channel members and including a work function layer, and a tungsten cap layer over the work function layer. A cross section of the tungsten cap layer along the direction includes a lower vertical portion and an upper horizontal portion and the lower vertical portion extends into the work function layer. In some embodiments, the work function layer includes TiN. In some implementations, the cross section of the tungsten cap layer includes a T shape. In some embodiments, a thickness of the tungsten cap layer is between about 2 nm and about 5 nm. In some instances, the semiconductor structure may further include a gate spacer layer extending along sidewalls of the gate structure and the tungsten cap layer.

In yet another exemplary aspect, the present disclosure is directed to a method. The method includes forming a stack over a substrate, wherein the stack includes a plurality of silicon layers interleaved by a plurality of silicon germanium layers, forming a fin-shaped structure from the stack and the substrate, the fin-shaped structure including a channel region and a source/drain region, forming a dummy gate stack over the channel region of the fin-shaped structure, depositing a gate spacer layer over the dummy gate stack, recessing the source/drain region to form a source/drain trench that exposes sidewalls of the plurality of silicon layers and the plurality of silicon germanium layers, selectively and partially recessing the plurality of silicon germanium layers to form a plurality of inner spacer recesses, forming a plurality of inner spacer features in the plurality of inner spacer recesses, depositing a source/drain feature in the source/drain trench, the source/drain feature being in contact with the plurality of silicon layers, after the depositing of the source/drain feature, removing the dummy gate stack, releasing the plurality of silicon layers in the channel region as a plurality of channel members, depositing gate stack layers to wrap around each of the plurality of channel members, etching back the gate stack layers to form a gate recess, and depositing a gate cap layer over the gate recess.

In some embodiments, the depositing of the gate cap layer includes depositing tungsten over the gate recess using atomic layer deposition (ALD). In some implementations, the depositing of the gate stack layers includes forming an interfacial layer, depositing a high-k dielectric layer over the interfacial layer, and depositing at least one work function layer over the high-k dielectric layer. In some implementations, the least one work function layer includes TiN. In some embodiments, the etching back of the gate stack layers forms a dent into the at least one work function layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first plurality of channel members being vertically stacked;
a second plurality of channel members being vertically stacked;
a gate dielectric layer wrapping around each of the first plurality of channel members and each of the second plurality of channel members;
an n-type work function layer disposed over the gate dielectric layer and wrapping around each of the first plurality of channel members;
a first p-type work function layer over the n-type work function layer and wrapping around each of the first plurality of channel members;
a second p-type work function layer disposed over the gate dielectric layer and wrapping around each of the second plurality of channel members;
a third p-type work function layer over the second p-type work function layer and wrapping around each of the second plurality of channel members; and
a gate cap layer over a top surface of the first p-type work function layer and a top surface of the third p-type work function layer such that the gate cap layer electrically couples the first p-type work function layer and the third p-type work function layer,
wherein sidewalls of the gate cap layer are disposed along and in contact with the gate dielectric layer.

2. The semiconductor device of claim 1, wherein the n-type work function layer comprises Ti, Al, Ag, Mn, Zr, TiAl, TiAlC, TaC, TaCN, TaAl, TaAlC, TiAlN, or a combination thereof.

3. The semiconductor device of claim 1, wherein the n-type work function layer comprises TiAlN.

4. The semiconductor device of claim 1, wherein the first p-type work function layer and the third p-type work function layer comprise TiN.

5. The semiconductor device of claim 1, wherein the second p-type work function layer comprises TaN.

6. The semiconductor device of claim 1, wherein the gate cap layer comprises tungsten.

7. The semiconductor device of claim 1,
wherein the first plurality of channel members extend between two n-type source/drain features along a direction,
wherein the second plurality of channel members extend between two p-type source/drain features along the direction.

8. The semiconductor device of claim 7, wherein, when viewed along the direction, a cross section of the gate cap layer comprises a T-shape.

9. The semiconductor device of claim 8,
wherein the cross section of the gate cap layer comprises a lower vertical portion and an upper horizontal portion,
wherein the lower vertical portion extends into the first p-type work function layer and the third p-type work function layer.

10. The semiconductor device of claim 1, wherein the gate cap layer comprises a thickness between 2 nm and about 5 nm.

11. A semiconductor structure, comprising:
a first source/drain feature and a second source/drain feature;
a plurality of channel members extending between the first source/drain feature and the second source/drain feature along a direction;
a gate structure wrapping around each of the plurality of channel members and comprising a gate dielectric layer and a work function layer disposed over the gate dielectric layer; and
a tungsten cap layer over the work function layer, wherein a cross section of the tungsten cap layer along the direction comprises a lower vertical portion and an upper horizontal portion, wherein the lower vertical portion extends into the work function layer,
wherein a top surface of the gate dielectric layer and a top surface of the tungsten cap layer are substantially coplanar.

12. The semiconductor structure of claim 11, wherein the work function layer comprises TiN.

13. The semiconductor structure of claim 11, wherein the cross section of the tungsten cap layer comprises a T shape.

14. The semiconductor structure of claim 11, wherein a thickness of the tungsten cap layer is between about 2 nm and about 5 nm.

15. The semiconductor structure of claim 11, further comprising a gate spacer layer extending along sidewalls of the gate structure and the tungsten cap layer.

16. A method, comprising:
forming a stack over a substrate, wherein the stack comprises a plurality of silicon layers interleaved by a plurality of silicon germanium layers;
forming a fin-shaped structure from the stack and the substrate, the fin-shaped structure comprising a channel region and a source/drain region;
forming a dummy gate stack over the channel region of the fin-shaped structure;
depositing a gate spacer layer over the dummy gate stack;
recessing the source/drain region to form a source/drain trench that exposes sidewalls of the plurality of silicon layers and the plurality of silicon germanium layers;
selectively and partially recessing the plurality of silicon germanium layers to form a plurality of inner spacer recesses;
forming a plurality of inner spacer features in the plurality of inner spacer recesses;
depositing a source/drain feature in the source/drain trench, the source/drain feature being in contact with the plurality of silicon layers;
after the depositing of the source/drain feature, removing the dummy gate stack;
releasing the plurality of silicon layers in the channel region as a plurality of channel members;
depositing a gate dielectric layer to wrap around each of the plurality of channel members;
depositing at least one work function layer over the gate dielectric layer such that the at least one work function layer wraps around each of the plurality of channel members;
selectively etching back the at least one work function layer to form a gate recess defined between two portions of the gate dielectric layer; and
depositing a gate cap layer over the gate recess such the gate cap layer is disposed between and in contact with the two portions of the gate dielectric layer.

17. The method of claim 16, wherein the depositing of the gate cap layer comprises depositing tungsten over the gate recess using atomic layer deposition (ALD).

18. The method of claim 16, wherein the selectively etching back comprises:
a dry etch process that includes use of $CF_4$, $Cl_2$, $BCl_3$), oxygen ($O_2$), diazene ($N_2H_2$), or argon (Ar); and
a wet etch process that includes use of ammonium hydroxide ($NH_4OH$), hydrogen peroxide ($H_2O_2$), hot deionized water (DI water), isopropyl alcohol (IPA), and ozone-deionized water ($O_3$-DI) ($O_3$).

19. The method of claim 18, wherein the least one work function layer comprises TiN.

20. The method of claim 18, wherein the etching back of the at least one work function layer forms a dent into the at least one work function layer.

* * * * *